US012772709B2

(12) United States Patent
Kim et al.

(10) Patent No.: US 12,772,709 B2
(45) Date of Patent: Oct. 20, 2026

(54) DISPLAY PANEL

(71) Applicant: Samsung Display Co., LTD., Yongin-si (KR)

(72) Inventors: Jeongki Kim, Yongin-si (KR); Jang-Il Kim, Yongin-si (KR); Jong-Hoon Kim, Yongin-si (KR); Kyounghae Min, Yongin-si (KR); Seongyeon Lee, Yongin-si (KR); Sujin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 449 days.

(21) Appl. No.: 18/408,778

(22) Filed: Jan. 10, 2024

(65) Prior Publication Data

US 2024/0334792 A1 Oct. 3, 2024

(30) Foreign Application Priority Data

Mar. 27, 2023 (KR) ........................ 10-2023-0039714

(51) Int. Cl.
*H10K 59/38* (2023.01)
*H10K 59/32* (2023.01)
(Continued)

(52) U.S. Cl.
CPC ........... *H10K 59/879* (2023.02); *H10K 59/32* (2023.02); *H10K 59/38* (2023.02); *H10K 2102/351* (2023.02)

(58) Field of Classification Search
CPC ...................................................... H10K 59/38
See application file for complete search history.

(56) References Cited

U.S. PATENT DOCUMENTS 11,574,962 B2 2/2023 Ha et al.
11,903,261 B2 2/2024 Kim et al.
(Continued)

FOREIGN PATENT DOCUMENTS

JP 2022-124207 8/2022
KR 10-2005-0072424 7/2005
(Continued)

OTHER PUBLICATIONS

Written translation of the written opinion of the International Search Authority for WO2024/205026 A1, retrieved from patenscope.wipo.int on May 28, 2026. (Year: 2026).*

*Primary Examiner* — Abdulmajeed Aziz
*Assistant Examiner* — Steven Y Horikoshi
(74) *Attorney, Agent, or Firm* — CANTOR COLBURN LLP

(57) ABSTRACT

A display panel includes a light emitting element, and an optical structure layer disposed on the light emitting element, wherein the optical structure layer includes a light control layer disposed on the light emitting element, a low refractive layer disposed on the light control layer, and a barrier layer disposed between the light control layer and the low refractive layer and including silicon oxynitride. The barrier layer includes a first layer adjacent to the low refractive layer and including nitrogen in an amount of less than about 1 at %, a second layer spaced apart from the low refractive layer, and including nitrogen in an amount of about 3 at % to about 30 at %, and a third layer spaced apart from the low refractive layer, and including nitrogen in an amount of less than about 3.2 at %.

20 Claims, 10 Drawing Sheets

(51) Int. Cl.
*H10K 59/80* (2023.01)
*H10K 102/00* (2023.01)

(56) References Cited

U.S. PATENT DOCUMENTS

| | | | |
|---|---|---|---|
| 2006/0152150 | A1 | 7/2006 | Boerner et al. |
| 2015/0276175 | A1 | 10/2015 | Moriya et al. |
| 2018/0047800 | A1* | 2/2018 | Choi .................... G09G 3/3233 |
| 2021/0217816 | A1* | 7/2021 | Ha ........................ H10K 50/115 |
| 2021/0408135 | A1* | 12/2021 | Kwon ............... G02F 1/133617 |
| 2022/0229214 | A1 | 7/2022 | Kim et al. |
| 2022/0255003 | A1 | 8/2022 | Han et al. |
| 2022/0359849 | A1 | 11/2022 | Kajimoto et al. |

FOREIGN PATENT DOCUMENTS

| | | |
|---|---|---|
| KR | 10-2021-0091384 | 7/2021 |
| KR | 10-2021-0157932 | 12/2021 |
| KR | 10-2355848 | 2/2022 |
| KR | 10-2022-0105708 | 7/2022 |

* cited by examiner

DISPLAY PANEL

CROSS-REFERENCE TO RELATED APPLICATION(S)

This application claims priority to and benefits of Korean Patent Application No. 10-2023-0039714 under 35 U.S.C. § 119, filed on Mar. 27, 2023, the entire contents of which are incorporated herein by reference.

BACKGROUND

1. Technical Field

Embodiments relate to a display panel, and more particularly, to a display panel having improved durability and reliability and increased display efficiency.

2. Description of the Related Art

A display panel includes a transmissive display panel that selectively transmits source light generated from a light source, and an emissive display panel that generates source light from a display panel itself. The display panel may include different types of color control pattern layers according to pixels to generate color images. The light control pattern layers may transmit only source light having a certain wavelength range or may convert the color of the source light. Some light control pattern layers may also change the characteristics of light without changing the color of the source light.

SUMMARY

Embodiments provide a display panel capable of improving durability, reliability, and display efficiency.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display panel may include a light emitting element that outputs source light, the light emitting element including a first electrode, an emission layer disposed on the first electrode, and a second electrode disposed on the emission layer, and an optical structure layer disposed on the light emitting element, wherein the optical structure layer may include a light control layer disposed on the light emitting element and including at least one light control pattern layer, a low refractive layer disposed on the light control layer, and a barrier layer disposed between the light control layer and the low refractive layer and including silicon oxynitride, the barrier layer may include a first layer adjacent to the low refractive layer and including nitrogen in an amount of less than about 1 at %, a second layer spaced apart from the low refractive layer with the first layer therebetween, and including nitrogen in an amount of about 3 at % to about 30 at %, and a third layer spaced apart from the low refractive layer with the first layer and the second layer therebetween, and including nitrogen in an amount of less than about 3.2 at %.

In an embodiment, the third layer may have a refractive index of about 1.3 to about 1.5 with respect to light in a wavelength range of about 400 nm to about 700 nm.

In an embodiment, the first layer may be directly disposed on the low refractive layer, the second layer may be directly disposed on the first layer, and the third layer may be directly disposed on the second layer.

In an embodiment, the first layer may have a thickness of about 500 Å or greater.

In an embodiment, the optical structure layer may further include a color filter layer spaced apart from the light control layer with the low refractive layer between the color filter layer and the light control layer and including a plurality of color filters.

In an embodiment, the at least one light control pattern layer may include a first light control pattern layer that converts the source light into first light and a second light control pattern layer that transmits the source light, and the first light control pattern layer may include quantum dots that convert the source light into the first light.

In an embodiment, the light control layer may further include a bank adjacent to the at least one light control pattern layer, and the barrier layer may be directly disposed on the at least one light control pattern layer and the bank.

In an embodiment, the low refractive layer may include a base resin, and a plurality of hollow particles dispersed in the base resin.

In an embodiment, the low refractive layer may have a refractive index of about 1.3 or less with respect to light in a wavelength range of about 400 nm to about 700 nm.

In an embodiment, the second layer may include a (2-1)-th layer adjacent to the first layer, and a (2-2)-th layer disposed between the (2-1)-th layer and the third layer, and the (2-1)-th layer and the (2-2)-th layer may include different amounts of nitrogen from each other.

In an embodiment, the optical structure layer may further include an additional barrier layer spaced apart from the barrier layer with the light control layer between the additional barrier layer and the barrier layer, and the additional barrier layer may be directly disposed on the at least one light control pattern layer.

In an embodiment, the display panel may further include a filling layer disposed between the light emitting element and the optical structure layer and covering the light emitting element.

In an embodiment, the first layer may have a refractive index of about 1.3 to about 1.5 with respect to light in a wavelength range of about 400 nm to about 700 nm, and the second layer may have a refractive index of about 1.4 to about 1.8 with respect to light in a wavelength range of about 400 nm to about 700 nm.

In an embodiment, the third layer may be in contact with the at least one light control pattern layer.

In an embodiment, the light emitting element may may include a plurality of light emitting stack members disposed between the first electrode and the second electrode, each of the plurality of light emitting stack members including the emission layer, the plurality of light emitting stack members may include a first light emitting stack member disposed on the first electrode and including a first emission layer, a charge generation layer disposed on the first light emitting stack member, and a second light emitting stack member disposed on the charge generation layer and including a second emission layer, and the first emission layer and the second emission layer may emit different color lights.

In an embodiment, a display panel may include a light emitting element that outputs source light, the light emitting element including a first electrode, an emission layer disposed on the first electrode, and a second electrode disposed on the emission layer, and an optical structure layer disposed on the light emitting element, wherein the optical structure layer may include a light control layer disposed on the light emitting element and including at least one light control pattern layer, a low refractive layer disposed on the light control layer, and a barrier layer disposed between the light control layer and the low refractive layer, the barrier layer may include a first layer, a second layer, and a third layer that are sequentially disposed from the low refractive layer, each of the first layer, the second layer, and the third layer including silicon oxynitride, the second layer may include an amount of nitrogen, which is about 3 times to about 60 times greater than the first layer, and the third layer may include nitrogen in an amount of less than about 3.2 at %.

In an embodiment, the first layer may be directly disposed below the low refractive layer, the second layer may be directly disposed below the first layer, and the third layer may be directly disposed below the second layer.

In an embodiment, a display panel may include a light emitting element that outputs source light, the light emitting element including a first electrode, an emission layer disposed on the first electrode, and a second electrode disposed on the emission layer, and an optical structure layer disposed on the light emitting element, wherein the optical structure layer may include a light control layer disposed on the light emitting element and including at least one light control pattern layer, a low refractive layer disposed on the light control layer, and a barrier layer disposed between the light control layer and the low refractive layer and including silicon oxynitride, the barrier layer may include a first layer directly disposed below the low refractive layer and including nitrogen in an amount of less than about 1 at %, a second layer directly disposed below the first layer, and including nitrogen in an amount of about 3 at % to about 30 at %, and a third layer directly disposed below the second layer, and the light control layer may be directly disposed below the third layer.

In an embodiment, the first layer may have a refractive index of about 1.3 to about 1.5 with respect to light in a wavelength range of about 400 nm to about 700 nm, the second layer may have a refractive index of about 1.4 to about 1.8 with respect to light in a wavelength range of about 400 nm to about 700 nm, and the third layer may have a refractive index of about 1.3 to about 1.5 with respect to light in a wavelength range of about 400 nm to about 700 nm.

In an embodiment, the first layer may have a thickness of about 500 Å or greater, the second layer may have a thickness of about 600 Å or greater, and the third layer may have a thickness of about 500 Å or greater.

BRIEF DESCRIPTION OF THE DRAWINGS

The accompanying drawings are included to provide a further understanding of the invention, and are incorporated in and constitute a part of this description. The drawings illustrate embodiments and, together with the description, serve to explain principles of the invention. In the drawings.

DETAILED DESCRIPTION OF THE EMBODIMENTS

Figure 1A:
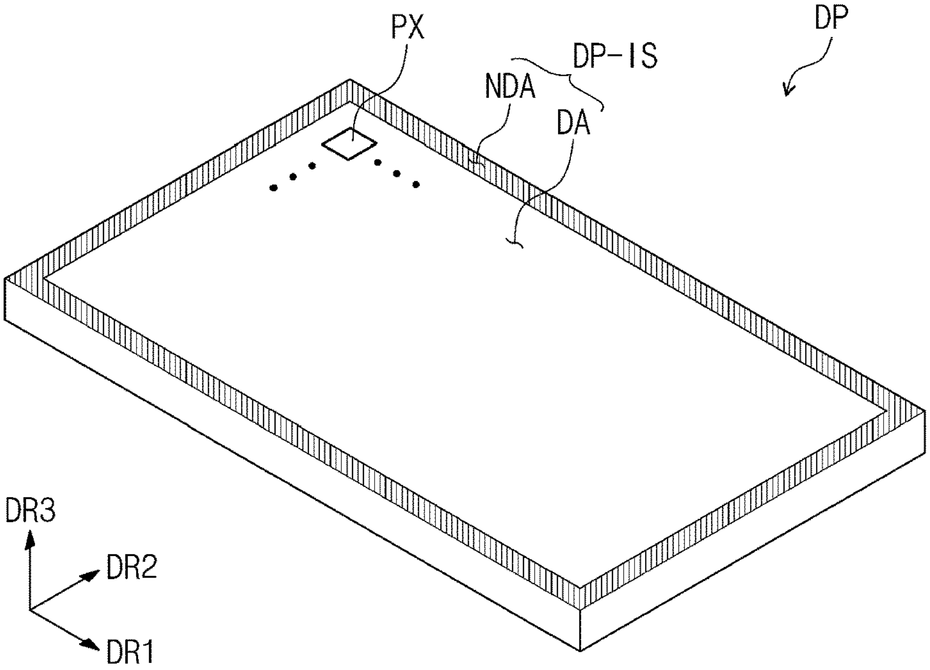
FIG. 1A is a schematic perspective view of a display panel according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, a display device according to an embodiment will be described with reference to the accompanying drawings.

Figure 1B:
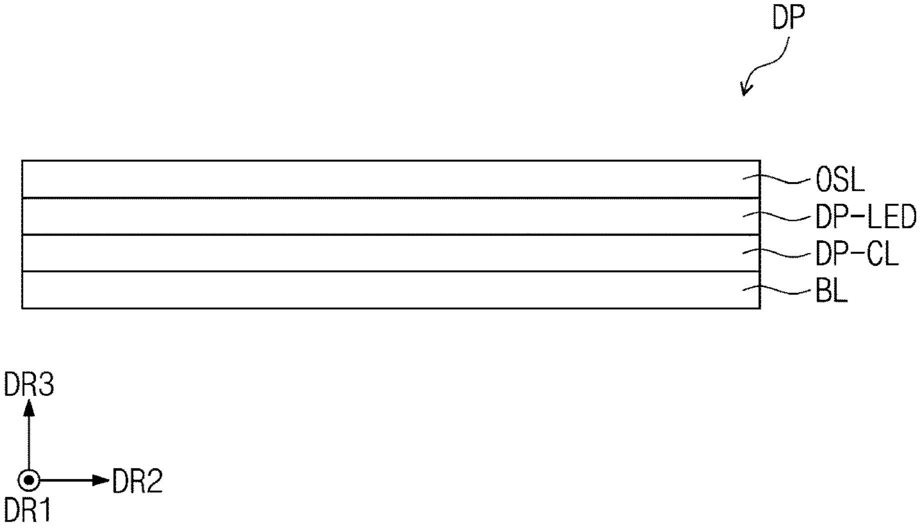
FIG. 1B is a schematic cross-sectional view of a display panel according to an embodiment.
Figure 1C:
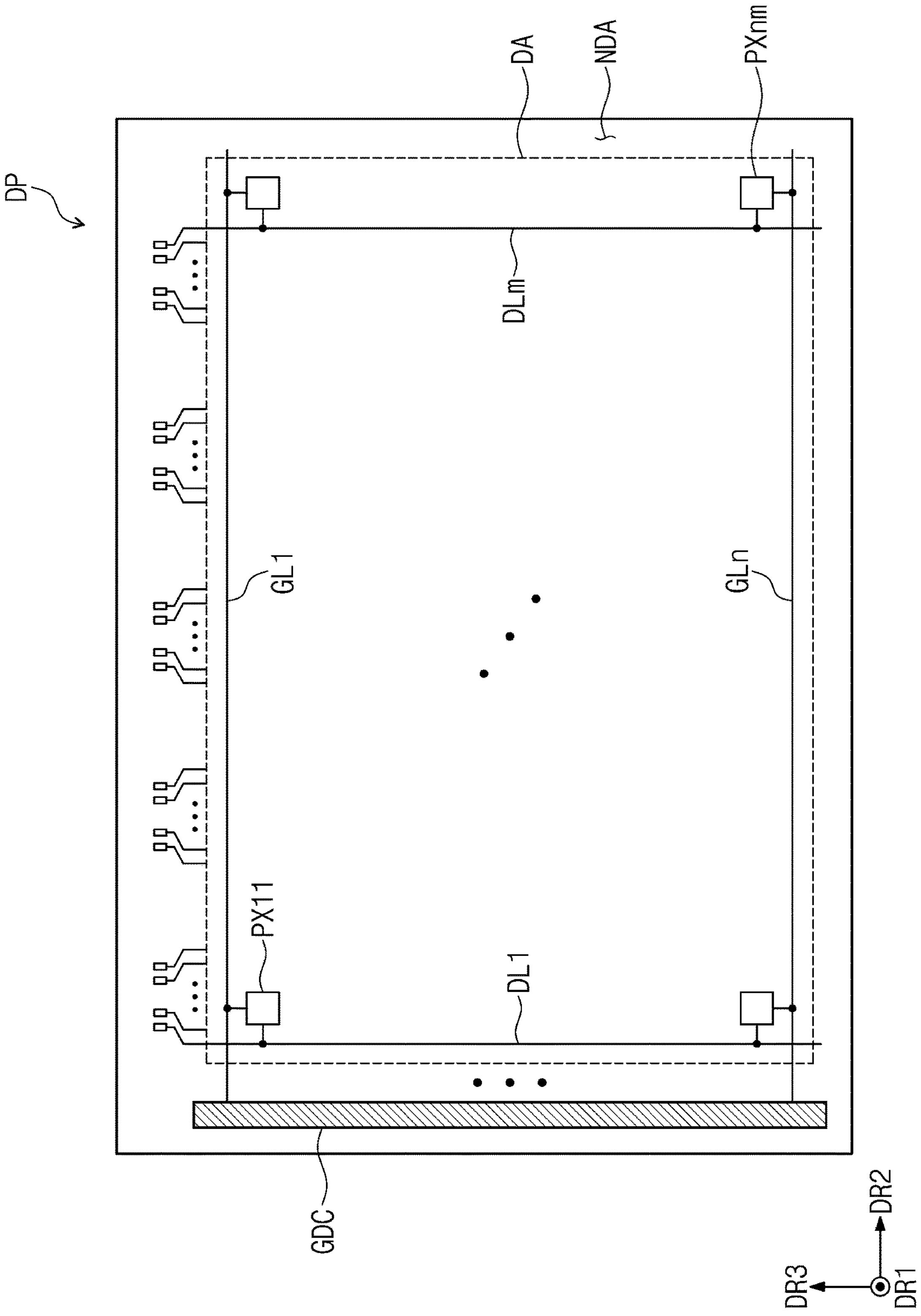
FIG. 1C is a schematic plan view of a display panel according to an embodiment.

FIG. 1A is a schematic perspective view of a display panel according to an embodiment. FIG. 1B is a schematic cross-sectional view of a display panel according to an embodiment. FIG. 1C is a schematic plan view of a display panel according to an embodiment.

As shown in FIG. 1A, a display panel DP may display images through a display surface DP-IS. The display surface DP-IS may be parallel to a plane defined by a first direction DR1 and a second direction DR2. The display surface DP-IS may include a display region DA and a non-display region NDA. A pixel PX may be disposed in the display region DA, but may not be disposed in the non-display region NDA. The non-display region NDA may be defined along an edge portion of the display surface DP-IS. The non-display region NDA may surround the display region DA. However, embodiments are not limited thereto, and the non-display region NDA may be omitted or disposed on only a side of the display region DA.

A normal direction of the display surface DP-IS, e.g., a thickness direction of the display panel DP, may be indicated by a third direction DR3. A front surface (or an upper surface) and a rear surface (or a lower surface) of respective layers or units which will be described below are separated by the third direction DR3. However, the first to third directions DR1, DR2, and DR3 shown in the embodiment are examples.

In an embodiment, the display panel DP having a planar front surface DP-IS is shown, but embodiments are not limited thereto. The display panel DP may include a curved display surface or a three-dimensional display surface. The three-dimensional display surface may include display regions indicating different directions.

As shown in FIG. 1B, the display panel DP may include a base substrate BS, a circuit element layer DP-CL, a display element layer DP-LED, and an optical structure layer OSL. The base substrate BS may include a synthetic resin substrate or a glass substrate. The circuit element layer DP-CL may include at least one insulating layer and a circuit element. The circuit element may include a signal line, a driving circuit of a pixel, and the like. The circuit element layer DP-CL may be formed by a process of forming an insulating layer, a semiconductor layer, and a conductive layer by a coating process, a vapor deposition process, and the like, and a process of patterning the insulating layer, the semiconductor layer, and the conductive layer by a photolithography process. The display element layer DP-LED may include at least one display element. The optical structure layer OSL may convert the color of light provided (or emitted) from the display element. The optical structure layer OSL may include a light control pattern layer and a structure for increasing light conversion efficiency.

FIG. 1C shows a planar arrangement relationship of signal lines GL1 to GLn and DL1 to DLm and pixels PX11 to PXnm. The signal lines GL1 to GLn and DL1 to DLm may include gate lines GL1 to GLn and data lines DL1 to DLm.

Each of the pixels PX11 to PXnm may be connected to a corresponding gate line among the gate lines GL1 to GLn and a corresponding data line among the data lines DL1 to DLm. Each of the pixels PX11 to PX may include a pixel driving circuit and a display element. More various types of signal lines may be provided in the display panel DP according to the configuration of the pixel driving circuits of the pixels PX11 to PXnm.

Although the pixels PX11 to PXnm arranged in a matrix form are shown as an example, embodiments are not limited thereto. The pixels PX11 to PXnm may be arranged in a Pentile® form. For example, points at which the pixels PX11 to PXnm are disposed may correspond to vertices of a diamond. A gate driving circuit GDC may be integrated on the display panel DP through an oxide silicon gate (OSG) driver circuit process or an amorphous silicon gate (ASG) driver circuit process.

Figure 2:
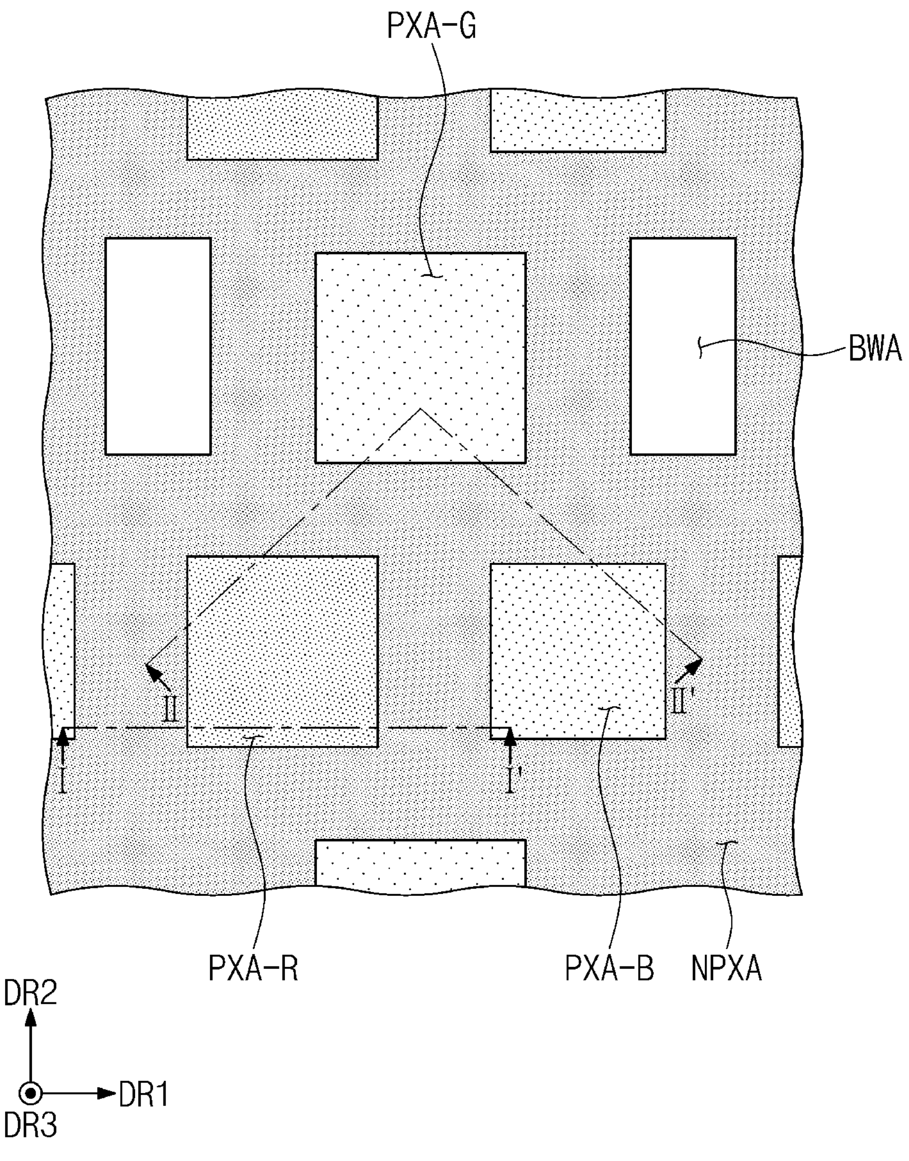
FIG. 2 is a schematic plan view enlarging a portion of a display panel according to an embodiment.

FIG. 2 is a schematic plan view enlarging a portion of a display panel according to an embodiment. FIG. 2 shows, as an example, a plane including three pixel regions PXA-R, PXA-B, and PXA-G and a bank well region BWA adjacent thereto in the display panel DP according to an embodiment. In an embodiment, the three types of pixel regions PXA-R, PXA-B, and PXA-G shown in FIG. 2 may be repeatedly disposed throughout the display region DA (see FIG. 1A).

A peripheral region NPXA may be disposed around the first to third pixel regions PXA-R, PXA-B, and PXA-G. The peripheral region NPXA may set boundaries between the first to third pixel regions PXA-R, PXA-B, and PXA-G. The peripheral region NPXA may surround the first to third pixel regions PXA-R, PXA-B, and PXA-G. A structure that prevents color mixing between the first to third pixel regions PXA-R, PXA-B, and PXA-G, for example, a pixel defining film PDL (see FIG. 3) or a bank BMP (see FIG. 3) may be disposed in the peripheral region NPXA.

FIG. 2 shows, as an example, the first to third pixel regions PXA-R, PXA-B, and PXA-G having the same planar shape and having different planar areas, but embodiments are not limited thereto. Areas of at least two of the first to third pixel regions PXA-R, PXA-B, and PXA-G may be equal to each other. Areas of the first to third pixel regions PXA-R, PXA-B, and PXA-G may be set according to the color of emitted light. The pixel region that emits light of red color among primary colors may have the largest area, and the pixel region that emits light of blue color among primary colors may have the smallest area.

FIG. 2 shows the first to third pixel regions PXA-R, PXA-B, and PXA-G having a rectangular shape, but embodiments are not limited thereto. In plan view, the first to third pixel regions PXA-R, PXA-B, and PXA-G may have other polygonal shapes (e.g., substantially polygonal shapes) such as a rhombus or a pentagon. In an embodiment, the first to third pixel regions PXA-R, PXA-B, and PXA-G may have a rectangular shape (e.g., a substantially rectangular shape) having rounded corners in plan view.

FIG. 2 shows that the third pixel region PXA-G is disposed in a first row, and the first pixel region PXA-R and the second pixel region PXA-B are disposed in a second row, but embodiments are not limited thereto. The arrangement of the first to third pixel regions PXA-R, PXA-B, and PXA-G may be variously changed. For example, the first to third pixel regions PXA-R, PXA-B, and PXA-G may be arranged in the same row.

One of the first to third pixel regions PXA-R, PXA-B, and PXA-G may provide (or emit) second light corresponding to a source light, another may provide (or emit) first light different from the second light, and the other may provide (or emit) third light different from the first light and the second light. In an embodiment, the second pixel region PXA-B may provide (or emit) the second light corresponding to the source light. In an embodiment, the first pixel region PXA-R may provide red light, the second pixel region PXA-B may provide (or emit) blue light, and the third pixel region PXA-G may provide (or emit) green light.

The bank well region BWA may be defined in the display region DA (see FIG. 1A). The bank well region BWA may be a region in which a bank well is formed in order to prevent defects due to erroneous adhesion in the process of patterning the light control pattern layers CCP-R, CCP-B, and CCP-G (see FIG. 4A) included in the light control layer CCL (see FIG. 4A). For example, the bank well region BWA may be a region in which a bank well formed by removing a portion of the bank BMP (see FIG. 4A) is defined.

FIG. 2 shows, as an example, that the two bank well regions BWA are defined to be adjacent to the third pixel regions PXA-G, but embodiments are not limited thereto, and the shape and arrangement of the bank well regions BWA may be variously changed.

Figure 3:
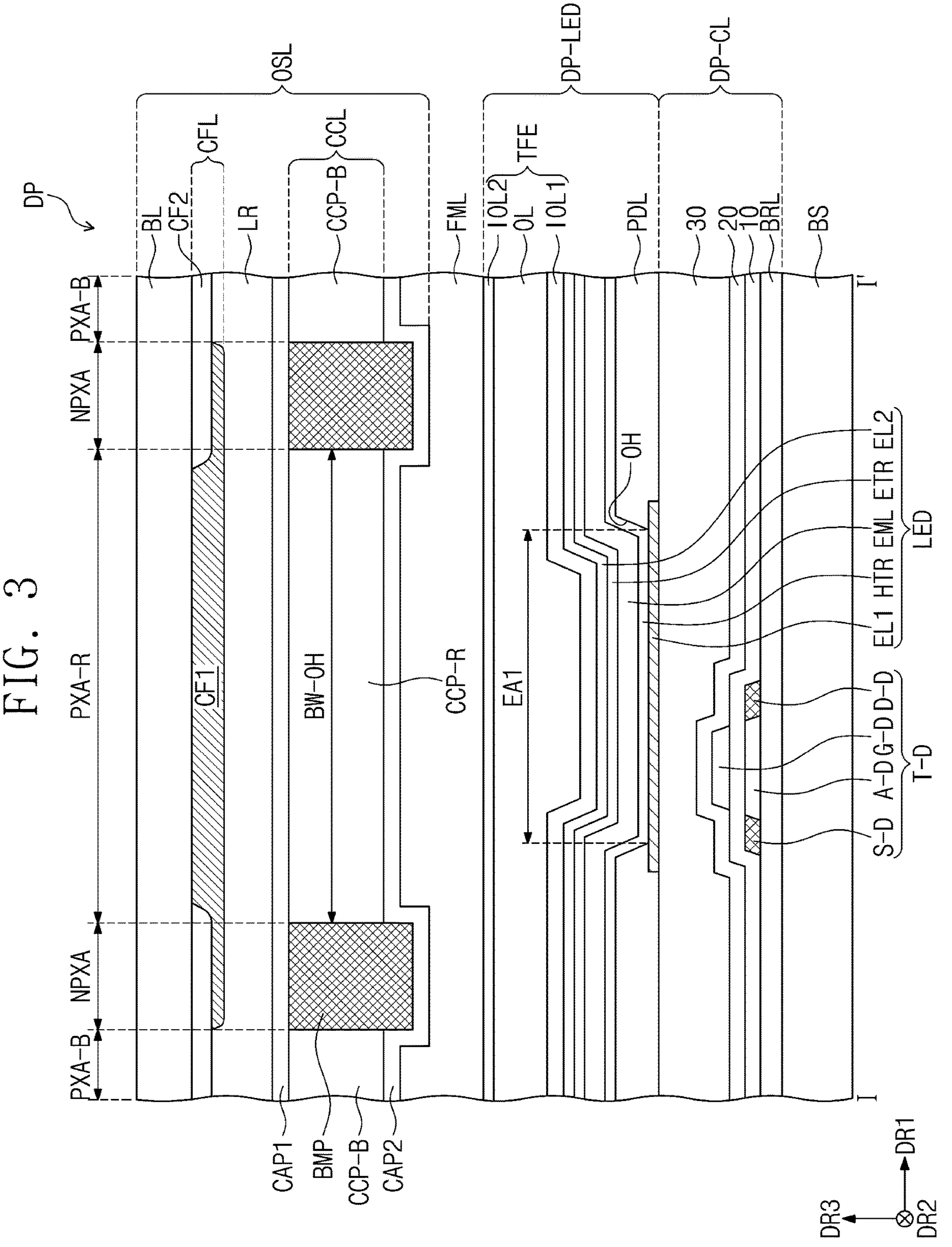
FIG. 3 is a schematic cross-sectional view of a display panel according to an embodiment.
Figure 4A:
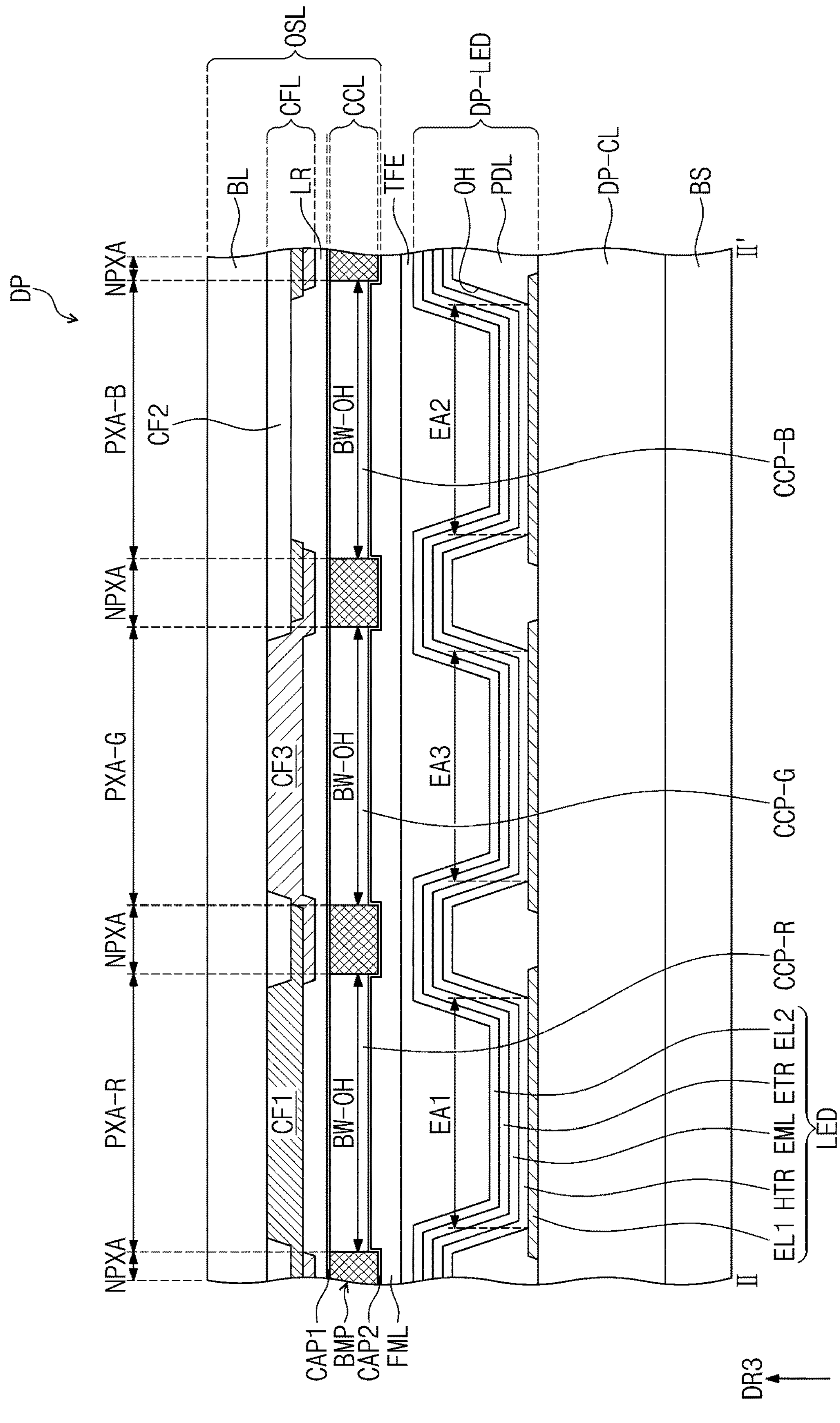
FIGS. 4A, 4B, and 4C are schematic views enlarging a partial region of a cross section of a display panel according to an embodiment.

FIG. 3 is a schematic cross-sectional view of a display panel according to an embodiment. FIG. 4A is a schematic view enlarging a partial region of a cross-section of a display panel according to an embodiment. FIG. 3 is a schematic cross-sectional view of a light emitting element included in a display panel according to an embodiment. FIG. 3 shows a cross section corresponding to line 'I-I' of FIG. 2. FIG. 4A shows a cross section corresponding to line II-II' of FIG. 2.

Referring to FIG. 3, the display panel DP according to an embodiment may include a base substrate BS, a circuit element layer DP-CL disposed on the base substrate BS, and a display element layer DP-LED disposed on the circuit element layer DP-CL. As used herein, the base substrate BS, the circuit element layer DP-CL, and the display element layer DP-LED may be collectively referred to as a lower panel.

The base substrate BS may be a member that provides a base surface on which components included in the circuit element layer DP-CL are disposed. In an embodiment, the base substrate BS may be a glass substrate, a metal substrate, a polymer substrate, or the like. However, embodiments are not limited thereto, and the base substrate BS may be an inorganic layer, a functional layer, or a composite material layer.

The base substrate BS may have a multilayer structure. For example, the base substrate BS may have a three-layer structure of a polymer resin layer, an adhesive layer, and a polymer resin layer. For example, the polymer resin layer may include a polyimide-based resin. For example, the polymer resin layer may include at least one of an acrylic resin, a methacrylic resin, a polyisoprene-based resin, a vinyl-based resin, an epoxy-based resin, a urethane-based resin, a cellulose-based resin, a siloxane-based resin, a polyamide-based resin, and a perylene-based resin. As used herein, an "a-based" resin may be considered as including a functional group of "a".

The circuit element layer DP-CL may be disposed on the base substrate BS. The circuit element layer DP-CL may include a transistor T-D as a circuit element. The configuration of the circuit element layer DP-CL may vary according to the design of the driving circuit of the pixel PX (see FIG. 1A), and the single transistor T-D is shown in FIG. 3 as an example. An arrangement relationship of an active region A-D, a source S-D, a drain D-D, and a gate G-D, which constitute the transistor T-D, are shown by way of example. The active region A-D, the source S-D, and the drain D-D may be regions divided according to the doping concentration or conductivity of the semiconductor pattern layer.

The circuit element layer DP-CL may include a lower buffer layer BRL, a first insulating layer 10, a second insulating layer 20, and a third insulating layer 30 that are disposed on the base substrate BS. For example, the lower buffer layer BRL, the first insulating layer 10, and the second insulating layer 20 may be inorganic layers, and the third insulating layer 30 may be an organic layer.

The display element layer DP-LED may include a light emitting element LED as a display element. The light emitting element LED may generate the source light described above. The light emitting element LED may include a first electrode EL1, a second electrode EL2, and an emission layer EML disposed therebetween. In an embodiment, the light emitting element LED may include an organic light emitting diode as a light emitting element. In an embodiment, the light emitting element may include a quantum dot light emitting diode. For example, the emission layer EML included in the light emitting element LED may include an organic light emitting material as a light emitting material, or the emission layer EML may include quantum dots as a light emitting material. In another example, the display element layer DP-LED may include an ultra-small light emitting element to be described below as a light emitting element. The ultra-small light emitting element may include, for example, a micro LED element and/or nano LED element, and the like. The micro light emitting element may be a light emitting element having a micro-scale size or nano-scale size and including an active layer disposed between semiconductor layers.

The first electrode EL1 may be disposed on the third insulating layer 30. The first electrode EL1 may be directly or indirectly connected to the transistor T-D, and a connection structure may be disposed between the first electrode EL1 and the transistor T-D.

The display element layer DP-LED may include the pixel defining film PDL. For example, the pixel defining film PDL may be an organic layer. A light emitting opening OH may be defined in the pixel defining film PDL. The light emitting opening OH of the pixel defining film PDL may expose at least a portion of the first electrode EL1. In an embodiment, a first light emitting region EA1 may be defined by the light emitting opening OH.

A hole control layer HTR, the emission layer EML, and an electron control layer ETR overlap at least the pixel region PXA-R. Each of the hole control layer HTR, the emission layer EML, the electron control layer ETR, and the second electrode EL2 may be disposed, in common, in the first to third pixel regions PXA-R, PXA-B, and PXA-G (scc FIG. 4A). Each of the hole control layer HTR, the emission layer EML, the electron control layer ETR, and the second electrode EL2 that overlap the first to third pixel regions PXA-R, PXA-B, and PXA-G (FIG. 4A) may have an integral shape. However, embodiments are not limited thereto, and at least one of the hole control layer HTR, the emission layer EML, and the electron control layer ETR may be formed separately for each of the first to third pixel regions PXA-R, PXA-B, and PXA-G (see FIG. 4A). In an embodiment, the emission layer EML may be patterned in the light emitting opening OH, and formed separately for each of the first to third pixel regions PXA-R, PXA-B, and PXA-G (scc FIG. 4A).

The hole control layer HTR may include a hole transport layer and may further include a hole injection layer.

The emission layer EML may generate the third light that is the source light. The emission layer EML may generate blue light. The blue light may include light having a wavelength of about 410 nm to about 480 nm. An emission spectrum of the blue light may have a maximum peak in a wavelength range of about 440 nm to about 460 nm.

The electron control layer ETR may include an electron transport layer and may further include an electron injection layer.

The display element layer DP-LED may include an encapsulation layer (e.g., thin film encapsulation layer) TFE that protects the second electrode EL2. The encapsulation layer TFE may include an organic material or an inorganic material. The encapsulation layer TFE may have multilayer structure in which an inorganic layer and an organic layer are repeatedly stacked with each other. In an embodiment, the encapsulation layer TFE may include a first inorganic encapsulation layer IOL1, an organic encapsulation layer OL, and/or a second inorganic encapsulation layer IOL2. The first and second inorganic encapsulation layers IOL1 and IOL2 may protect the light emitting element LED from external moisture, and the organic encapsulation layer OL may prevent dent defects on the light emitting element LED caused by foreign substances introduced during the manufacturing process. For example, the display panel DP may further include a refractive index control layer on an upper side of the encapsulation layer TFE to improve light output efficiency.

As shown in FIG. 3, the optical structure layer OSL may be disposed on the encapsulation layer TFE. The optical structure layer OSL may include a light control layer CCL, a low refractive layer LR, a color filter layer CFL, and a base layer BL. As used herein, the optical structure layer OSL may be referred to as an upper panel.

The light control layer CCL may be disposed on the display element layer DP-LED including the light emitting element LED. The light control layer CCL may include a bank BMP, light control pattern layers CCP-R and CCP-B, and a barrier layer CAP1.

The bank BMP may include a base resin and an additive. The base resin may be formed of various resin compositions, which are generally referred to as a binder. The additive may include a coupling agent and/or a photo-initiator. The additive may further include a dispersant.

The bank BMP may include a black coloring agent to block light. The bank BMP may include a black dye or black pigment mixed with a base resin. In an embodiment, the black coloring agent may include carbon black, a metal such as chromium, or an oxide thereof.

The bank BMP may include a bank opening BW-OH corresponding to (or overlapping) the light emitting opening OH. In plan view, the bank opening BW-OH may overlap the light emitting opening OH and may have a larger area than the light emitting opening OH. For example, the bank opening BW-OH may have a larger area than the light emitting region EA1 defined by the light emitting opening OH. As used herein, the wording "corresponding" means that the two components overlap when viewed in the thickness direction DR3 of the display panel DP, and is not limited to the two components having the same area.

The light control pattern layers CCP-R and CCP-B may be disposed inside the bank opening BW-OH. At least some of the light control pattern layers CCP-R and CCP-B may change optical properties of the source light. In an embodiment, the first light control pattern layer CCP-R may change optical properties of the source light.

The first light control pattern layer CCP-R may include quantum dots for changing the optical properties of the source light. The first light control pattern layer CCP-R may include quantum dots that convert the source light into light having a different wavelength. In the light control pattern layer CCP-R overlapping the first pixel region PXA-R, the quantum dots may convert blue light, which is the source light, into red light.

In the description, a quantum dot indicates a crystal of a semiconductor compound. The quantum dot may emit light of various emission wavelengths according to the size of the crystal. The quantum dot may emit light of various emission wavelengths by adjusting an element ratio in the quantum dot compound.

The quantum dot may have a diameter of, for example, about 1 nm to about 10 nm.

The quantum dot may be synthesized by a wet chemical process, a metal organic chemical vapor deposition process, a molecular beam epitaxy process, or a process similar thereto.

The wet chemical process may be a method of mixing an organic solvent and a precursor material and then growing a quantum dot particle crystal. In case that the crystal grows, the organic solvent naturally functions as a dispersant coordinated to a surface of the quantum dot crystal and may control the growth of the crystal. Therefore, the wet chemical process may be more efficient than vapor deposition methods such as a metal organic chemical vapor deposition (MOCVD) process or a molecular beam epitaxy (MBE) process, and may control the growth of quantum dot particles by a low-cost process.

A core of the quantum dot may be selected from a Group II-VI compound, a Group III-V compound, a Group III-VI compound, a Group I-III-VI compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. For example, the Group II-VI semiconductor compound may further include a Group I metal and/or a Group IV element. The Group I-II-VI compound may be selected from CuSnS or CuZnS, and the Group II-IV-VI compound may be selected from ZnSnS and the like. The Group I-II-IV-VI compound may be selected from quaternary compounds selected from the group consisting of $Cu_2ZnSnS_2$, $Cu_2ZnSnS_4$, $Cu_2ZnSnSe_4$, $Ag_2ZnSnS_2$, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may be selected from a ternary compound selected from the group consisting of AgInS, $AgInS_2$, CuInS, $CuInS_2$, $AgGaS_2$, $CuGaS_2CuGaO_2$, $AgGaO_2$, $AgAlO_2$, or a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. For example, the Group III-V compound may further include a Group II metal. For example, InZnP and the like may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof.

Examples of the Group II-IV-V semiconductor compound may be a ternary compound selected from the group consisting of ZnSnP, $ZnSnP_2$, $ZnSnAs_2$, $ZnGeP_2$, $ZnGeAs_2$, $CdSnP_2$, and $CdGeP_2$ and a mixture thereof.

The Group IV element may be selected from the group consisting of Si, Ge, and a mixture thereof. The Group IV compound may be a binary compound selected from the group consisting of SiC, SiGe, and a mixture thereof.

Each element included in the multi-element compound such as the binary compound, ternary compound, and quaternary compound may be present in particles at a uniform concentration or a non-uniform concentration. For example, Formula above indicates the types of elements included in a compound, and element ratios in the compound may be different. For example, $AgInGaS_2$ may indicate $AgIn_xGa_{1-x}S_2$, where x is a real number between 0 and 1.

For example, the binary compound, the ternary compound, or the quaternary compound may be present (or included) in particles having a uniform concentration distribution, or may be present (or included) in the same particles having a partially different concentration distribution. For example, a core/shell structure may include a quantum dot, which surrounds another quantum dot. The core/shell structure may have a concentration gradient in which the concentration of an element included in the shell becomes lower as being closer the core.

In some embodiments, a quantum dot may have the core/shell structure including a core having nano-crystals, and a shell surrounding the core, which are described above. The shell of the quantum dot may function as a protection layer to prevent the chemical deformation of the core so as to keep semiconductor properties, and/or a charging layer to impart electrophoresis properties to the quantum dot. The shell may be a single layer or multiple layers. Examples of the shell of the quantum dot may be a metal oxide or a non-metal oxide, a semiconductor compound, or a combination thereof.

For example, the metal oxide or a non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but embodiments are not limited thereto.

For example, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but embodiments are not limited thereto.

The quantum dot may have, in an emission wavelength spectrum, a full width of half maximum (FWHM) of about 45 nm or less, e.g., about 40 nm or less, and, e.g., about 30 nm or less, and in this range, the color purity or the color reproducibility may be improved. For example, light emitted through the quantum dot may be emitted in all directions, and thus a wide viewing angle may be improved.

For example, the form of a quantum dot is not limited as long as it is a form commonly used, but, e.g., a quantum dot in the form of spherical, pyramidal, multi-arm, or cubic nanoparticles, nanotubes, nanowires, nanofibers, nanoplatelets, and the like may be used.

As the size of the quantum dot or the ratio of elements in the quantum dot compound is adjusted, the energy band gap may be accordingly controlled to obtain light of various wavelengths from the quantum dot emission layer. Therefore, by using the quantum dots as described above (by using quantum dots of different sizes or by using quantum dots having different element ratios in the quantum dot compound), a light emitting element emitting light of various wavelengths may be implemented. For example, the size of the quantum dots or the ratio of elements in the quantum dot compound may be adjusted to emit red light, green light, and/or blue light. For example, the quantum dots may emit white light by combining light of various colors.

In an embodiment, the quantum dots included in the first light control pattern layer CCP-R overlapping the first pixel region PXA-R may have a red emission color. As the particle size of the quantum dot becomes smaller, the emitted light may have the shorter wavelength range. For example, among the quantum dots with the same core, the particle size of the quantum dots that emit green light may be smaller than the particle size of the quantum dots that emit red light. For example, among the quantum dots with the same core, the particle size of quantum dots that emit blue light may be smaller than the particle size of quantum dots that emit green light. However, embodiments are not limited thereto, and even in the quantum dots having the same core, the particle size may be controlled according to a shell forming material and a shell thickness.

For example, in case that the quantum dots have various emission colors such as blue, red, and green, the quantum dots having different emission colors may have different core materials.

The first light control pattern layer CCP-R may further include scatterers. The first light control pattern layer CCP-R may include quantum dots that convert blue light into red light, and scatterers that scatter light.

The scatterer may be an inorganic particle. For example, the scatterer may include at least one of $TiO_2$, ZnO, $Al_2O_3$, $SiO_2$, and hollow silica. The scatterers may include any one of $TiO_2$, ZnO, $Al_2O_3$, $SiO_2$, or hollow silica, or a mixture of two or more materials selected from among $TiO_2$, ZnO, $Al_2O_3$, $SiO_2$, and hollow silica.

The first light control pattern layer CCP-R may include a base resin for dispersing the quantum dots and the scatterers. The base resin may be a medium in which the quantum dots and the scatterers are dispersed, and may be formed of various resin compositions which is generally referred to as a binder. For example, the base resin may be an acrylic resin, a urethane-based resin, a silicon-based polymer, an epoxy-based resin, and the like. The base resin may be a transparent resin.

In the embodiment, the first light control pattern layer CCP-R may be formed by an inkjet process. A liquid composition may be provided in the bank opening BW-OH. A composition that is polymerized by a thermal curing process or a photo-curing process may be reduced in volume after curing.

A stepped portion may be generated between a lower surface of the bank BMP and a lower surface of the first light control pattern layer CCP-R. For example, the lower surface of the bank BMP may be defined to be higher than the lower surface of the first light control pattern layer CCP-R. A difference in height between the lower surface of the bank BMP and the lower surface of the first light control pattern layer CCP-R may be, for example, about 2 μm to about 3 μm.

The light control layer CCL may include a barrier layer CAP1 disposed on a surface of the first light control pattern layer CCP-R. The barrier layer CAP1 may function to prevent penetration of moisture and/or oxygen (hereinafter, referred to as 'moisture/oxygen') and improve optical properties of the optical structure layer OSL by adjusting a refractive index. The barrier layer CAP1 may be disposed on an upper surface or a lower surface of the first light control pattern layer CCP-R to prevent the first light control pattern layer CCP-R to be exposed to moisture/oxygen, and, e.g., to prevent quantum dots included in the first light control pattern layer CCP-R to be exposed to moisture/oxygen. The barrier layer CAP1 may also protect the first light control pattern layer CCP-R from external impact.

In an embodiment, the barrier layer CAP1 may be spaced apart from the display element layer DP-LED with the first light control pattern layer CCP-R between the barrier layer CAP1 and the display element layer DP-LED. For example, the barrier layer CAP1 may be disposed on the upper surface of the first light control pattern layer CCP-R. In an embodiment, the light control layer CCL may include an additional barrier layer CAP2 disposed between the first light control pattern layer CCP-R and the display element layer DP-LED. The barrier layer CAP1 may cover the upper surface of the first light control pattern layer CCP-R adjacent to the low refractive layer LR, and the additional barrier layer CAP2 may cover the lower surface of the first light control pattern layer CCP-R adjacent to the display element layer DP-LED. As used herein, the "upper surface" may be a surface placed on an upper portion with respect to the third direction DR3, and the "lower surface" may be a surface placed on a lower portion with respect to the third direction DR3.

For example, the barrier layer CAP1 and the additional barrier layer CAP2 may cover a surface of the bank BMP as well as the first light control pattern layer CCP-R.

The barrier layer CAP1 may cover a surface of the first light control pattern layer CCP-R and the bank BMP adjacent to the low refractive layer LR. The barrier layer CAP1 may be disposed (e.g., directly disposed) below a low refractive layer LR. The additional barrier layer CAP2 may be disposed to follow a stepped portion between the bank BMP and the first light control pattern layer CCP-R. The additional barrier layer CAP2 may be disposed (e.g., directly disposed) above a filling layer FML.

The barrier layer CAP1 and the additional barrier layer CAP2 may include an inorganic material. In the display panel DP according to an embodiment, the barrier layer CAP1 may include silicon oxynitride ($SiO_xN_y$). Both the barrier layer CAP1 and the additional barrier layer CAP2 may include silicon oxynitride. However, embodiments are not limited thereto, and the barrier layer CAP1 disposed above the first light control pattern layer CCP-R may include silicon oxynitride, and the additional barrier layer CAP2 disposed below the first light control pattern layer CCP-R may include silicon oxide ($SiO_x$). However, embodiments are not limited thereto.

The barrier layer CAP1 including silicon oxynitride may limit an amount of silicon, oxygen, and nitrogen in the silicon oxynitride film to a certain range to prevent moisture/oxygen from penetrating into the first light control pattern layer CCP-R, may increase film durability, and may have a refractive index range that does not reduce light efficiency of a display panel. Hereinafter, the amount and detailed stacked structure of the barrier layer CAP1 according to an embodiment will be described in more detail in the description of FIGS. 6A and 6B.

The color filter layer CFL may be disposed on the light control layer CCL. The color filter layer CFL may include at least one color filter. The color filter may transmit light having a specific wavelength range and may block light having a wavelength other than the specific wavelength range. A first color filter CF1 of the first pixel region PXA-R may transmit red light and may block green light and blue light.

The first color filter CF1 may include a base resin and a dye and/or pigment dispersed in the base resin. The base resin may be a medium in which dyes and/or pigments are dispersed, and may be formed of various resin compositions that are generally referred to as binders.

The first color filter CF1 may have a uniform thickness in the first pixel region PXA-R. The light, generated by converting the source light, which is blue light, into red light through the light control pattern layer CCP-R, may be provided to the outside with uniform luminance in the first pixel region PXA-R.

The optical structure layer OSL may include the low refractive layer LR. The low refractive layer LR may be disposed between the light control layer CCL and the color filter layer CFL. The low refractive layer LR may be disposed above the light control layer CCL to prevent the first light control pattern layer CCP-R from being exposed to moisture/oxygen. For example, the low refractive layer LR may function as an optical functional layer that is disposed between the first light control pattern layer CCP-R and the first color filter CF1 to increase light extraction efficiency or prevent reflected light from being incident on the light control layer CCL. The low refractive layer LR may have a smaller refractive index than a layer adjacent thereto.

The low refractive layer LR may include at least one inorganic layer. For example, the low refractive layer LR may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a thin metal film in which light transmittance is ensured, etc. However, embodiments are not limited thereto, and the low refractive layer LR may include an organic layer. The low refractive layer LR may have, for example, a structure in which hollow particles are dispersed in an organic polymer resin. The low refractive layer LR may be formed of a single layer or a plurality of layers.

In an embodiment, the display panel DP may further include a base layer BL disposed on the color filter layer CFL. The base layer BL may be a member that provides a base surface on which the color filter layer CFL, the low refractive layer LR, the light control layer CCL, and the like are disposed. The base layer BL may be a glass substrate, a metal substrate, a plastic substrate, and the like. However, embodiments are not limited thereto, and the base layer BL may be an inorganic layer, an organic layer, or a composite material layer. In another example, the base layer BL may be omitted in an embodiment.

For example, an anti-reflection layer may be disposed on the base layer BL. The anti-reflection layer may be a layer that reduces the reflectance of external light incident from the outside. The anti-reflection layer may be a layer that selectively transmits light emitted from the display panel DP. In an embodiment, the anti-reflection layer may be a single layer including a dye and/or a pigment dispersed in a base resin. The anti-reflection layer may be provided as a continuous layer (e.g., a single layer) that overlaps the entire surfaces of the first to third pixel regions PXA-R, PXA-B, and PXA-G (see FIG. 4A).

The anti-reflection layer may not include a polarizing layer. Accordingly, light, which passes through the anti-reflection layer and is incident on the side of the display element layer DP-LED, may be unpolarized light. The display element layer DP-LED may receive unpolarized light from above the anti-reflection layer.

The display panel DP according to an embodiment may include a lower panel having a display element layer DP-LED, and an upper panel (e.g., optical structure layer) OSL including the light control layer CCL and the color filter layer CFL. In an embodiment, a filling layer FML may be disposed between the lower panel and the upper panel OSL. In an embodiment, the filling layer FML may fill a space between the display element layer DP-LED and the light control layer CCL. The filling layer FML may be disposed (e.g., directly disposed) on the encapsulation layer TFE, and the additional barrier layer CAP2 may be disposed (e.g., directly disposed) on the filling layer FML. A lower surface of the filling layer FML may contact an upper surface of the encapsulation layer TFE, and an upper surface of the filling layer FML may contact a lower surface of the additional barrier layer CAP2.

The filling layer FML may function as a buffer between a display element layer DP-LED and the light control layer CCL. In an embodiment, the filling layer FML may have a shock absorbing function, etc., and may increase the strength of the display panel DP. The filling layer FML may be formed from a filler resin including a polymer resin. For example, the filling layer FML may be formed from a filling layer resin including an acrylic resin or an epoxy-based resin.

The filling layer FML may have a component, which is different from the encapsulation layer TFE disposed therebelow and the additional barrier layer CAP2 disposed thereabove. For example, the filling layer FML, the encapsulation layer TFE and the additional barrier layer CAP2 may be respectively formed by separate processes. For example, the filling layer FML may be formed of a material different from those of the encapsulation layer TFE and the additional barrier layer CAP2.

Referring to FIG. 4A, the display panel DP may include a base substrate BS and a circuit element layer DP-CL disposed on the base substrate BS. The circuit element layer DP-CL may be disposed on the display substrate BS. The circuit element layer DP-CL may include an insulating layer, a semiconductor pattern layer, a conductive pattern layer, a signal line, and the like. The insulating layer, the semiconductor layer, and the conductive layer may be formed on the base layer BL by a coating method or a deposition method, and subsequently, the insulating layer, the semiconductor layer, and the conductive layer may be selectively patterned by performing a photolithography process multiple time. Then, the semiconductor pattern layer, the conductive pattern layer, and the signal line included in the circuit element layer DP-CL may be formed. In an embodiment, the circuit element layer DP-CL may include a transistor, a buffer layer, and insulating layers.

A light emitting element LED according to an embodiment may include a first electrode EL1, a second electrode EL2 facing the first electrode EL1, and an emission layer EML disposed between the first electrode EL1 and the second electrode EL2. The emission layer EML included in the light emitting element LED may include an organic light emitting material or quantum dots as a light emitting material. The light emitting element LED may further include the hole control layer HTR and the electron control layer ETR. For example, the light emitting element LED may further include a capping layer disposed on the second electrode EL2.

The pixel defining film PDL may be disposed on the circuit element layer DP-CL and may cover a portion of the first electrode EL1. A light emitting opening OH may be defined in the pixel defining film PDL. The light emitting opening OH of the pixel defining film PDL may expose at least a portion of the first electrode EL1. In the embodiment, the light emitting regions EA1, EA2, and EA3 may correspond to (or overlap) a partial region of the first electrode EL1 exposed by the light emitting opening OH.

The display element layer DP-LED may include a first light emitting region EA1, a second light emitting region EA2, and a third light emitting region EA3. The first light emitting region EA1, the second light emitting region EA2, and the third light emitting region EA3 may be regions divided by the pixel defining film PDL. The first light emitting region EA1, the second light emitting region EA2, and the third light emitting region EA3 may respectively correspond to a first pixel region PXA-R, a second pixel region PXA-B, and a third pixel region PXA-G.

The light emitting regions EA1, EA2, and EA3 may overlap the pixel regions PXA-R, PXA-B, and PXA-G and may not overlap the bank well region BWA. In plan view, the area of the pixel regions PXA-R, PXA-B, and PXA-G divided by the bank BMP may be larger than the area of the light emitting regions EA1, EA2, and EA3 divided by the pixel defining film PDL.

In the light emitting element LED, the first electrode EL1 may be disposed on the circuit element layer DP-CL. The first electrode EL1 may be an anode or cathode. For example, the first electrode EL1 may be a pixel electrode. The first electrode EL1 may be a transmissive electrode, a transflective electrode, or a reflective electrode.

The hole control layer HTR may be disposed between the first electrode EL1 and the emission layer EML. The hole control layer HTR may include at least one of a hole injection layer, a hole transport layer, and an electron blocking layer. The hole control layer HTR may be disposed as a common layer to overlap the light emitting regions EA1, EA2, and EA3 and the entirety of the pixel defining films PDL that separate the light emitting regions EA1, EA2, and EA3. However, embodiments are not limited thereto, and the hole control layer HTR may be provided (or formed) by a patterning process so that the hole control layer HTR may be separately disposed to correspond to (or to overlap) each of the light emitting regions EA1, EA2, and EA3.

The emission layer EML may be disposed on the hole control layer HTR. In an embodiment, the emission layer EML may be provided as a common layer to overlap the light emitting regions EA1, EA2, and EA3 and the entirety of the pixel defining films PDL that separate the light emitting regions EA1, EA2, and EA3. In an embodiment, the emission layer EML may emit blue light. The emission layer EML may overlap all of the hole control layer HTR and the electron control layer ETR.

However, embodiments are not limited thereto, and in an embodiment, the emission layer EML may be disposed in the light emitting opening OH. For example, the emission layers EML may be separately formed to correspond to (or to overlap) the light emitting regions EA1, EA2, and EA3 which are separated by the pixel defining films PDL. All of the emission layers EML formed separately to correspond to (or to overlap) the light emitting regions EA1, EA2, and EA3 may emit blue light or may emit light having different wavelength ranges.

The emission layer EML may have a single layer formed of a single material, a single layer formed of a plurality of materials different from each other, or a multi-layered structure that has a plurality of layers formed of a plurality of materials different from each other. The emission layer EML may include a fluorescent material or a phosphorescent material. In the light emitting element according to an embodiment, the emission layer EML may include an organic light emitting material, a metal organic complex, or quantum dots as a light emitting material. For example, FIGS. 3 and 4A show, as an example, a light emitting element LED including one emission layer EML, but in an embodiment, the light emitting element may include light emitting stack members each having at least one emission layer.

Figure 5:
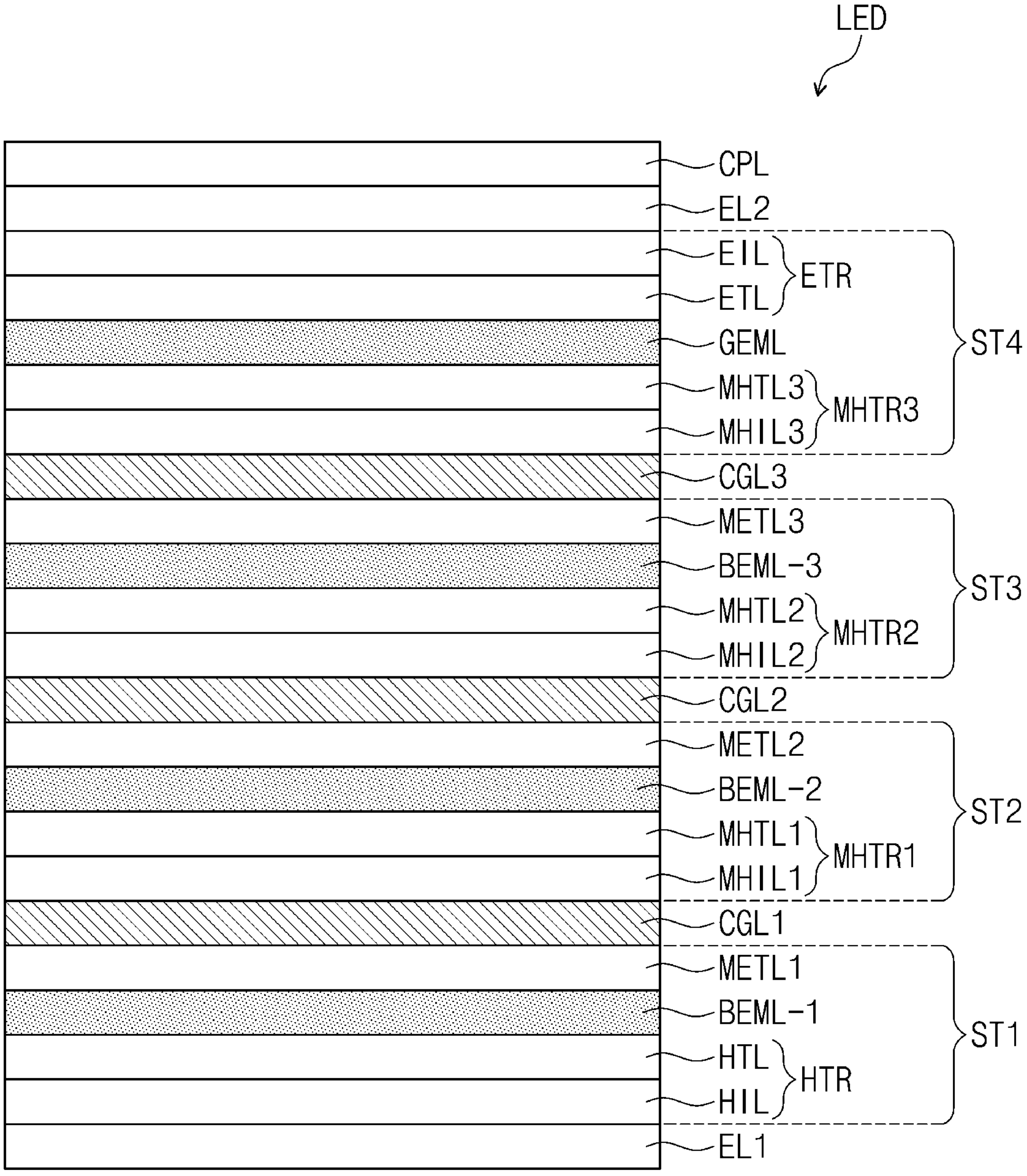
FIG. 5 is a schematic cross-sectional view of a light emitting element according to an embodiment.

FIG. 5 is a schematic cross-sectional view of a light emitting element according to an embodiment. FIG. 5 shows, as an example, a light emitting element LED including light emitting stack members ST1, ST2, ST3, and ST4, unlike the light emitting element according to an embodiment shown in FIGS. 3 and 4A.

Referring to FIG. 5, a light emitting element LED according to an embodiment may include a first electrode EL1, a second electrode EL2 facing the first electrode EL1, and the first to fourth light emitting stack members ST1, ST2, ST3, and ST4 disposed between the first electrode EL1 and the second electrode EL2. A capping layer CPL may be disposed on the second electrode EL2. For example, although FIG. 5 shows, as an example, that the light emitting element LED may include four light emitting stack members, the number of light emitting stack members included in the light emitting element LED may be less than or more than four.

The light emitting element LED may include first to third charge generation layers CGL1, CGL2, and CGL3 disposed between the first to fourth light emitting stack members ST1, ST2, ST3, and ST4.

In case that a voltage is applied to the first to third charge generation layers CGL1, CGL2, and CGL3, charges (e.g., electrons and holes) may be generated by forming a complex by an oxidation-reduction reaction. For example, each of the first to third charge generation layers CGL1, CGL2, and CGL3 may provide the generated charges to the adjacent light emitting stack members ST1, ST2, ST3, and ST4. The first to third charge generation layers CGL1, CGL2, and CGL3 may double an efficiency of the current generated in each of the adjacent light emitting stack members ST1, ST2, ST3, and ST4, and may function to adjust the balance of the charges between the adjacent light emitting stack members ST1, ST2, ST3, and ST4.

The first to third charge generation layers CGL1, CGL2, and CGL3 may respectively include an n-type layer and a p-type layer. The first to third charge generation layers CGL1, CGL2, and CGL3 may have a structure in which an n-type layer and a p-type layer are coupled to each other. However, embodiments are not limited thereto, and the first to third charge generation layers CGL1, CGL2, and CGL3 may include only one of an n-type layer and a p-type layer. The n-type layer may be a charge generation layer that provides electrons to adjacent stack members. The n-type layer may be a layer in which a base material is doped with an n-dopant. The p-type layer may be a charge generation layer that provide holes to adjacent stack members.

In an embodiment, each of the first to third charge generation layers CGL1, CGL2, and CGL3 may have a thickness of about 1 angstrom (Å) to about 150 angstroms (Å). The concentration of the n-dopant doped with the first to third charge generation layers CGL1, CGL2, and CGL3 may be about 0.1% to about 3%, and, e.g., may be about 1%. In case that the concentration of the dopant is less than about 0.1%, the effect of the first to third charge generation layers CGL1, CGL2, and CGL3 for adjusting the balance of charges may be hardly achieved. In case that the concentration of the dopant is greater than about 3%, the light efficiency of the light emitting element LED may be reduced.

The first to third charge generation layers CGL1, CGL2, and CGL3 may respectively include a charge generation compound composed of an arylamine-based organic compound, a metal, a metal oxide, a metal carbide, a metal fluoride, or a mixture thereof. For example, the arylamine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The metal oxide, metal carbide, and metal fluoride may include $Re_2O_7$, $MoO_3$, $V_2O_5$, $WO_3$, $TiO_2$, $Cs_2CO_3$, BaF, LiF, or CsF. However, materials of the first to third charge generation layers CGL1, CGL2, and CGL3 are not limited to the above examples.

Each of the first to fourth light emitting stack members ST1, ST2, ST3, and ST4 may include an emission layer. The first light emitting stack member ST1 may include a first emission layer BEML-1, the second light emitting stack member ST2 may include a second emission layer BEML-2, the third light emitting stack member ST3 may include a third emission layer BEML-3, and the fourth light emitting stack member ST4 may include a fourth emission layer GEML. Some of the emission layers included in the first to fourth light emitting stack members ST1, ST2, ST3, and ST4 may emit light of substantially the same color, and some may emit light of different colors.

In an embodiment, the first to third emission layers BEML-1, BEML-2, and BEML-3 of the first to third light emitting stack members ST1, ST2, and ST3 may emit substantially the same first color light. For example, the first color light may be blue light, which is the above-described source light. The wavelength range of the light emitted from the first to third emission layers BEML-1, BEML-2, and BEML-3 may be about 420 nm to about 480 nm.

The fourth emission layer GEML of the fourth light emitting stack member ST4 may emit a second color light different from the first color light. For example, the second color light may be green light. The wavelength range of the light emitted from the fourth emission layer GEML may be about 520 nm to about 600 nm.

At least a portion of the first to fourth emission layers BEML-1, BEML-2, BEML-3, and GEML may have a two-layer structure including different host materials. For example, in the two-layer structure, one layer may include a hole-transporting host material, and the other layer may include an electron-transporting host material. The electron-transporting host material may be a material containing an electron-transporting moiety in a molecular structure.

The first light emitting stack member ST1 may further include the hole control layer HTR that transports holes provided from the first electrode EL1 to the first emission layer BEML-1, and a first intermediate electron control layer METL1 that transport electrons generated from a first charge generation layer CGL1 to the first emission layer BEML-1.

The hole control layer HTR may include a hole injection layer HIL disposed on the first electrode EL1, and a hole transport layer HTL disposed on the hole injection layer HIL. However, embodiments are not limited thereto, and the hole control layer HTR may further include at least one of a hole buffer layer, an emission auxiliary layer, and an electron blocking layer. The hole buffer layer may compensate a resonance distance according to wavelengths of light emitted from an emission layer EML, and may thus increase luminous efficiency. The electron blocking layer may be a layer that functions to prevent electrons from being injected from an electron control layer ETR to a hole control layer HTR.

The first intermediate electron control layer METL1 may include a first intermediate electron transport layer disposed on the first emission layer BEML-1. However, embodiments are not limited thereto, and the first intermediate electron control layer METL1 may further include at least one of an electron buffer layer and a hole blocking layer.

The second light emitting stack member ST2 may include a first intermediate hole control layer MHTR1 that transports holes generated from the first charge generation layer CGL1 to the second emission layer BEML-2 and a second intermediate electron control layer METL2 that transports electrons provided from a second charge generation layer CGL2 to the second emission layer BEML-2.

The first intermediate hole control layer MHTR1 may include a first intermediate hole injection layer MHIL1 disposed on the first charge generation layer CGL1, and a first intermediate hole transport layer MHTL1 disposed on the first intermediate hole injection layer MHIL1. The first intermediate hole control layer MHTR1 may further include at least one of a hole buffer layer, an emission auxiliary layer, and an electron blocking layer which is disposed on the first intermediate hole transport layer MHTL1.

The second intermediate electron control layer METL2 may include a second intermediate electron transport layer disposed on the second emission layer BEML-2. However, embodiments are not limited thereto, and the second intermediate electron control layer METL2 may further include at least one of an electron buffer layer and a hole blocking layer which is disposed between the second intermediate electron transport layer and the second emission layer BEML-2.

The third light emitting stack member ST3 may include a second intermediate hole control layer MHTR2 that transports holes generated from a second charge generation layer CGL2 to the third emission layer BEML-3, and a third intermediate electron control layer METL3 that transports electrons provided from a third charge generation layer CGL3 to the third emission layer BEML-3.

The second intermediate hole control layer MHTR2 may include a second intermediate hole injection layer MHIL2 disposed on the second charge generation layer CGL2, and a second intermediate hole transport layer MHTL2 disposed on the second intermediate hole injection layer MHIL2. However, embodiments are not limited thereto, and the second intermediate hole control layer MHTR2 may further include at least one of a hole buffer layer, an emission auxiliary layer, and an electron blocking layer which is disposed on the second intermediate hole transport layer MHTL2.

The third intermediate electron control layer METL3 may include a third intermediate electron transport layer disposed on the third emission layer BEML-3. However, embodiments are not limited thereto, and the third intermediate electron control layer METL3 may further include at least one of an electron buffer layer and a hole blocking layer, which is disposed between the third intermediate electron transport layer and the third emission layer BEML-3.

The fourth light emitting stack member ST4 may further include a third intermediate hole control layer MHTR3 that transports holes generated from the third charge generation layer CGL3 to the fourth emission layer GEML, and the electron control layer ETR that transports electrons provided from the second electrode EL2 to the fourth emission layer GEML.

The third intermediate hole control layer MHTR3 may include a third intermediate hole injection layer MHIL3 disposed on the third charge generation layer CGL3, and a third intermediate hole transport layer MHTL3 disposed on the third intermediate hole injection layer MHIL3. However, embodiments are not limited thereto, and the third intermediate hole control layer MHTR3 may further include at least one of a hole buffer layer, an emission auxiliary layer, and an electron blocking layer, which is disposed on the third intermediate hole transport layer MHTL3.

The electron control layer ETR may include an electron transport layer ETL disposed on the fourth emission layer GEML and an electron injection layer EIL disposed on the electron transport layer ETL. However, embodiments are not limited thereto, and the electron control layer ETR may further include at least one of an electron buffer layer and a hole blocking layer which is disposed between the electron transport layer ETL and the fourth emission layer GEML.

In an embodiment, the light emitting element LED may emit light in a direction from the first electrode EL1 to the second electrode EL2, and based on the direction in which the light is emitted, the hole control layer HTR may be disposed below the light emitting stack members ST1, ST2, ST3, and ST4, and the electronic control layer ETR may be disposed above the light emitting stack members ST1, ST2, ST3, and ST4. However, embodiments are not limited thereto, and based on the light emitting direction, the light emitting element may have an inverted element structure in which the electron control layer ETR is disposed below the light emitting stack members ST1, ST2, ST3, and ST4 and the hole control layer HTR is disposed above the light emitting stack members ST1, ST2, ST3, and ST4.

Referring back to FIG. 4A, the electronic control layer ETR may be disposed between the emission layer EML and the second electrode EL2. The electron control layer ETR may include at least one of an electron injection layer, an electron transport layer, and a hole blocking layer. Referring to FIG. 4A, the electron control layer ETR may be disposed as a common layer to overlap the light emitting regions EA1, EA2, and EA3 and the entirety of the pixel defining films PDL that separate the light emitting regions EA1, EA2, and EA3. However, embodiments are not limited thereto, and the electron control layer ETR may be provided (or formed) by a patterning process so that the electron control layer ETR may be separately disposed corresponding to each of the light emitting regions EA1, EA2, and EA3.

The second electrode EL2 may be provided on the electronic control layer ETR. The second electrode EL2 may be a common electrode. The second electrode EL2 may be a cathode or an anode but embodiments are not limited thereto. For example, in case that the first electrode EL1 is an anode, the second electrode EL2 may be a cathode, and in case that the first electrode EL1 is a cathode, the second electrode EL2 may be an anode. The second electrode EL2 may be a transmissive electrode, a transflective electrode, or a reflective electrode.

The encapsulation layer TFE may be disposed on the display element layer DP-LED. For example, in an embodiment, the encapsulation layer TFE may be disposed on the second electrode EL2. For example, in case that the light emitting element LED includes a capping layer, the encapsulation layer TFE may be disposed on the capping layer. As described above, the encapsulation layer TFE may include at least one organic film and at least one inorganic film, and the inorganic film and the organic film may be alternately disposed.

The display panel DP according to an embodiment may include an optical structure layer OSL disposed on the display element layer DP-LED. The optical structure layer OSL may include a light control layer CCL, a color filter layer CFL, and a base layer BL.

The light control layer CCL may include a light converter. The light converter may be quantum dots or phosphors. The light converter may wavelength-convert the provided light and emit the wavelength-converted light. For example, the light control layer CCL may be a layer including the quantum dots or a layer including the phosphors at least in part.

The light control layer CCL may include light control pattern layers CCP-R, CCP-B, and CCP-G. The light control pattern layers CCP-R, CCP-B, and CCP-G may be spaced apart from each other. The light control pattern layers CCP-R, CCP-B, and CCP-G may be disposed to be spaced apart from each other by the bank BMP. The light control pattern layers CCP-R, CCP-B, and CCP-G may be disposed in the bank opening BW-OH defined in the bank BMP. However, embodiments are not limited thereto. FIG. 4A shows that the bank BMP has a rectangular shape in cross-section and does not overlap the light control pattern layers CCP-R, CCP-B, and CCP-G. However, at least a portion of the edges of the light control pattern layers CCP-R, CCP-B, and CCP-G may overlap the bank BMP. The bank BMP may have a trapezoidal shape in cross-section. As the bank BMP is more adjacent to the display element layer DP-LED, the cross-sectional width may become greater.

The light control pattern layers CCP-R, CCP-B, and CCP-G may be portions that convert the wavelength of light provided from the display element layer DP-LED or transmit the provided light. The light control pattern layers CCP-R, CCP-B, and CCP-G may be formed by an inkjet process. A liquid ink composition may be provided in the bank openings BW-OH, and the provided ink composition may be polymerized by a thermal curing process or a photo-curing process to form the light control pattern layers CCP-R, CCP-B, and CCP-G.

The light control layer CCL may include a first light control pattern layer CCP-R having first quantum dots that converts the source light provided from the light emitting element LED into the first light, a second light control pattern layer CCP-B that transmits the source light, and a third light control pattern layer CCP-G including second quantum dots that converts the source light into the second light.

In an embodiment, the first light control pattern layer CCP-R may provide (or emit) red light, which is the first light, and the second light control pattern layer CCP-B may be provided by transmitting blue light, which is the source light, among the source light provided by the light emitting element LED. The third light control pattern layer CCP-G may provide (or emit) green light, which is the second light. For example, the first quantum dots may be red quantum dots, and the second quantum dots may be green quantum dots.

For example, the light control layer CCL may further include the scatterers. The first light control pattern layer CCP-R may include the first quantum dots and the scatterers, the third light control pattern layer CCP-G may include the second quantum dots and the scatterers, and the second light control pattern layer CCP-B may not include the quantum dots and include the scatterers.

Each of the first light control pattern layer CCP-R, the second light control pattern layer CCP-B, and the third light control pattern layer CCP-G may include a base resin for dispersing the quantum dots and the scatterers. In an embodiment, the first light control pattern layer CCP-R may include the first quantum dots and the scatterers dispersed in a base resin, the third light control pattern layer CCP-G may include the second quantum dots and the scatterers dispersed in the base resin, and the second light control pattern layer CCP-B may include the scatterers dispersed in the base resin.

The light control layer CCL may include the barrier layer CAP1 disposed on a surface of a light control pattern layer (e.g., CCP-B, CCP-G, or CCP-R). The light control layer CCL may include the barrier layer CAP1 spaced apart from the display element layer DP-LED with the light control pattern layer CCP-R between the barrier layer CAP1 and the display element layer DP-LED, and the additional barrier layer CAP2 adjacent to the display element layer DP-LED.

In the display panel DP, the optical structure layer OSL may include the color filter layer CFL disposed on the light control layer CCL. The color filter layer CFL may include color filters CF1, CF2, and CF3. The color filter layer CFL may include a first color filter CF1 that transmits the first light, a second color filter CF2 that transmits the source light, and a third color filter CF3 that transmits the second light. In an embodiment, the first color filter CF1 may be a red filter, the second color filter CF2 may be a blue filter, and the third color filter CF3 may be a green filter.

Each of the filters CF1, CF2, and CF3 may include a polymer photosensitive resin and a colorant. The first color filter CF1 may contain a red colorant, the second color filter CF2 may contain a blue colorant, and the third color filter CF3 may contain a green colorant. The first color filter CF1 may include a red pigment or a red dye, the second color filter CF2 may include a blue pigment or a blue dye, and the third color filter CF3 may include a green pigment or a green dye.

The first to third color filters CF1, CF2, and CF3 may respectively correspond to the first pixel region PXA-R, the second pixel region PXA-B, and the third pixel region PXA-G. For example, the first to third color filters CF1, CF2, and CF3 may respectively correspond to the first light control pattern layer to third light control pattern layer CCP-R, CCP-B, and CCP-G.

For example, the color filters CF1, CF2, and CF3 that transmit different light corresponding to the peripheral region NPXA disposed between the pixel regions PXA-R, PXA-B, and PXA-G may be disposed to overlap each other. The color filters CF1, CF2, and CF3 may be overlapped in the third direction DR3, which is the thickness direction, to separate a boundary between the adjacent pixel regions PXA-R, PXA-B, and PXA-G. In another example, the color filter layer CFL may include a light blocking portion for dividing a boundary between the adjacent color filters CF1, CF2, and CF3. The light blocking portion may be formed of a blue filter or may include an organic light blocking material or an inorganic light blocking material that includes a black pigment or a black dye.

The optical structure layer OSL may include a low refractive layer LR disposed between the light control layer CCL and the color filter layer CFL. The low refractive layer LR may be disposed between the light control pattern layers CCP-R, CCP-B, and CCP-G and the color filters CF1, CF2, and CF3. The low refractive layer LR may be disposed on the upper portion of the light control layer CCL to block the light control pattern layer CCP-R, CCP-B, and CCP-G from being exposed to moisture/oxygen. For example, the low refractive layer LR may function as an optical functional layer that is disposed between the light control pattern layer CCP-R, CCP-B, and CCP-G and the color filters CF1, CF2, and CF1 to increase light extraction efficiency or prevent reflected light from being incident on the light control layer CCL. The low refractive layer LR may have a smaller refractive index than other layers adjacent thereto.

The low refractive layer LR may include at least one inorganic layer. For example, the low refractive layer LR may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a thin metal film in which light transmittance is ensured, etc. However, embodiments are not limited thereto, and the low refractive layer LR may include an organic layer. The low refractive layer LR may have, for example, a structure in which hollow particles are dispersed in an organic polymer resin. The low refractive layer LR may be formed of a single layer or a plurality of layers.

In an embodiment, the optical structure layer OSL may further include a base layer BL disposed on the color filter layer CFL. The base layer BL may be a member that provides a base surface on which the color filter layer CFL, the light control layer CCL, and the like are disposed. The base layer BL may be a glass substrate, a metal substrate, a plastic substrate, and the like. However, embodiments are not limited thereto, and the base layer BL may be an inorganic layer, an organic layer, or a composite material layer. In another example, the base layer BL may be omitted in an embodiment.

Figure 4B:
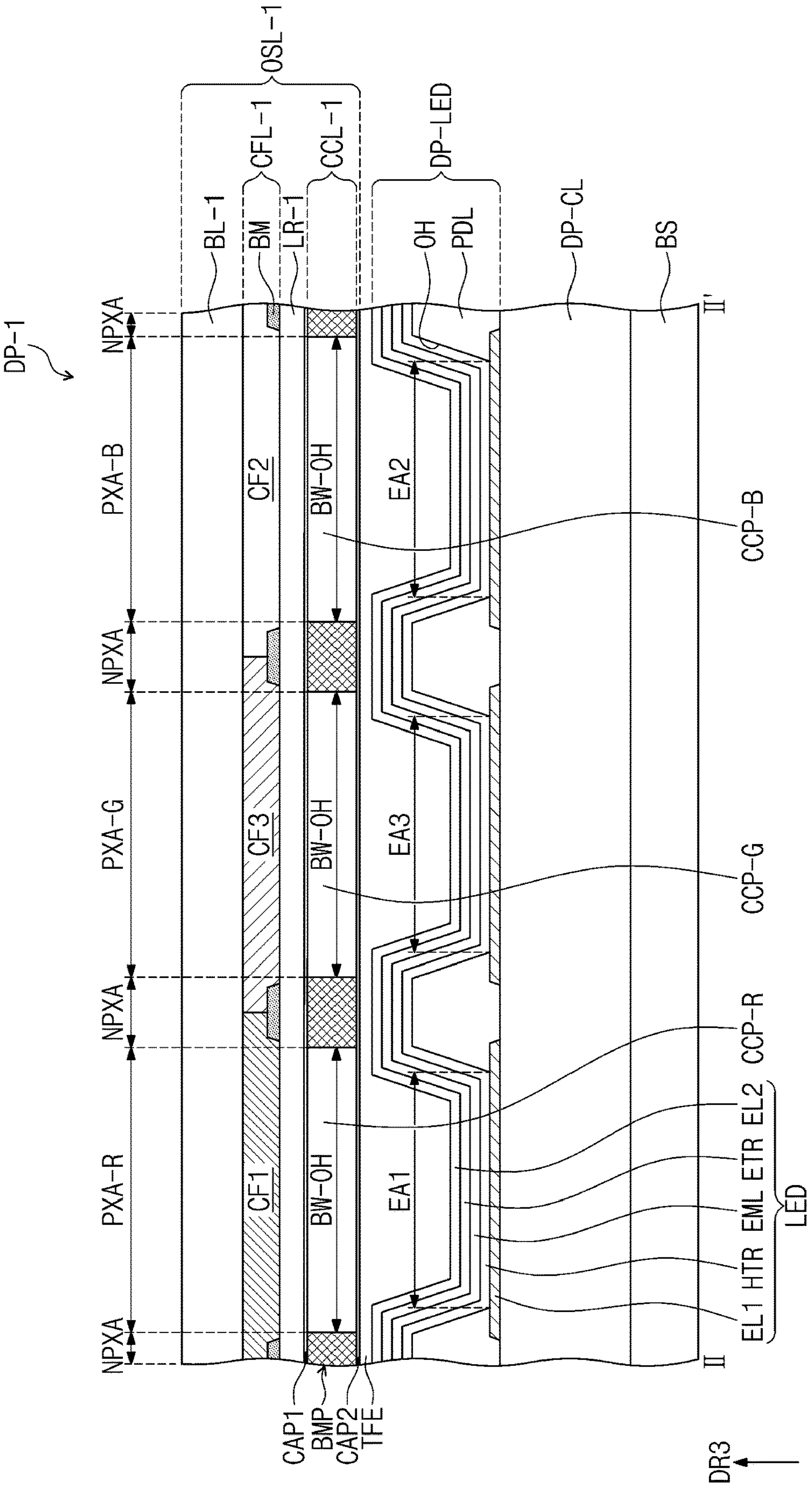
Figure 4C:
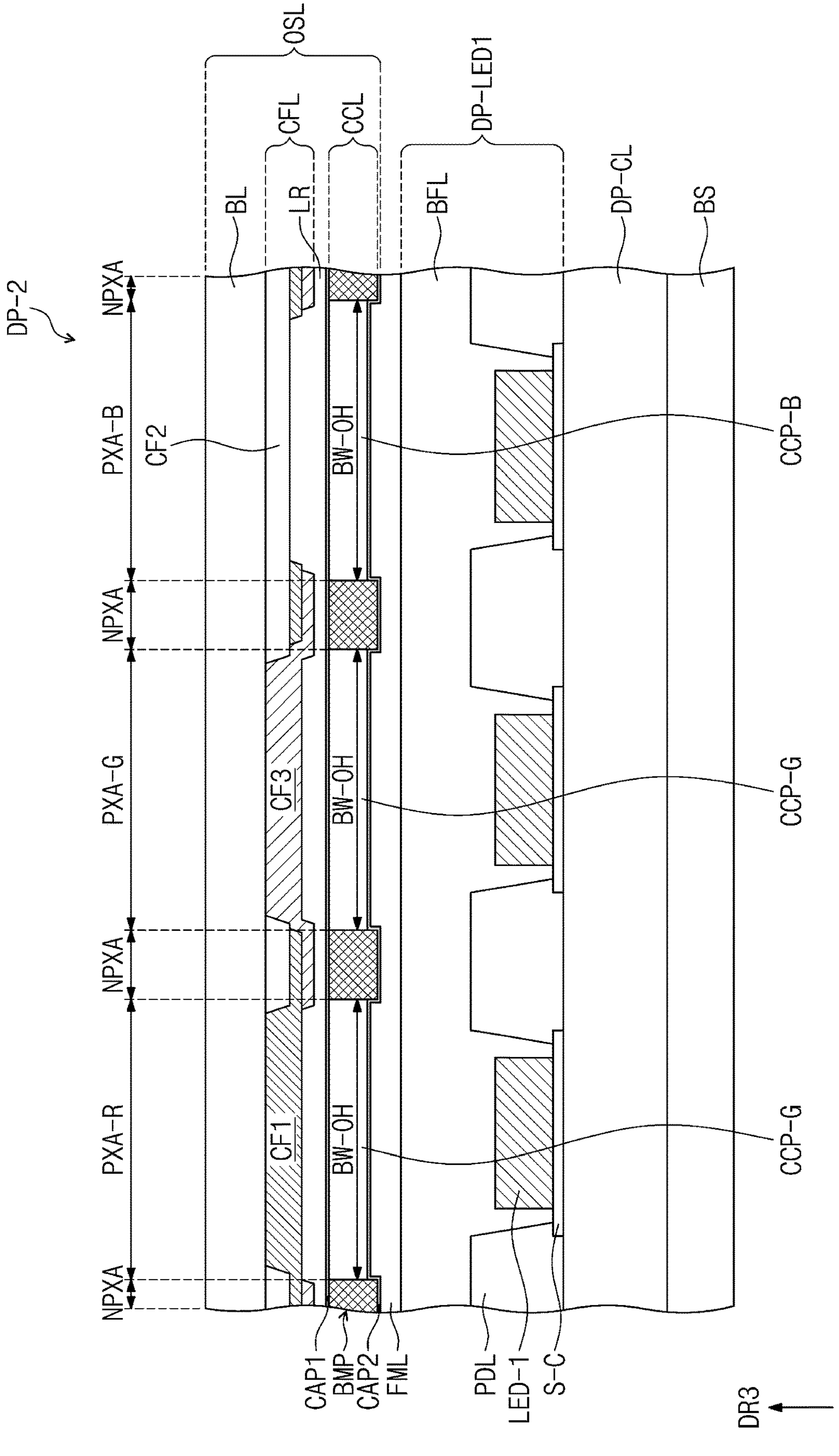

FIG. 4B and FIG. 4C are each a schematic view enlarging a partial region of a cross-section of a display panel according to an embodiment. FIG. 4B and FIG. 4C each show the display panel DP of an embodiment shown in FIG. 4A and display panels DP-1 and DP-2 of other embodiments.

Referring to FIG. 4B, the display panel DP-1 according to an embodiment may include a base substrate BS, a circuit element layer DP-CL disposed on the base substrate BS, a lower panel including the display element layer DP-LED disposed on the circuit element layer DP-CL, and an optical structure layer OSL-1 disposed on the lower panel. In the display panel DP-1 according to an embodiment, the optical structure layer OSL-1 may include a light control layer CCL-1 sequentially stacked on the encapsulation layer TFE, a low refractive layer LR-1, a color filter layer CFL-1, and a base layer BL-1. The optical structure layer OSL-1 may include a barrier layer CAP1 and an additional barrier layer CAP2 disposed on upper and lower surfaces of the light control layer CCL-1.

The light control layer CCL-1 may be disposed on the display element layer DP-LED and the encapsulation layer TFE with the additional barrier layer CAP2 between the light control layer CCL-1 and the encapsulation layer TFE. The light control layer CCL-1 may include banks BMP and light control pattern layers CCP-B, CCP-G, and CCP-R disposed between the banks BMP. The low refractive layer LR may be disposed on the light control layer CCL-1.

The color filter layer CFL-1 may include color filters CF1, CF2, and CF3, and a light blocking portion BM.

Compared to the display panel DP shown in FIG. 4A, the display panel DP-1 according to an embodiment shown in FIG. 4B is an embodiment in which the light control layer CCL-1, the low refractive layer LR, and the color filter layer CFL-1 are disposed by using an upper surface of the encapsulation layer TFE as the base surface. For example, the light control pattern layers CCP-B, CCP-G, and CCP-R of the light control layer CCL-1 may be formed on the encapsulation layer TFE by a roll-to-roll process, and the filters CF1, CF2, and CF3 of the color filter layer CFL-1 may be sequentially formed on the light control layer CCL-1 by a roll-to-roll process. The light control layer CCL-1 may be formed by using an upper surface of the additional barrier layer CAP2 disposed on the encapsulation layer TFE as a base surface, and may thus have a shape in which the light control layer CCL shown in FIG. 4A is vertically inverted. For example, the banks BMP and the light control pattern layers CCP-B, CCP-G, and CCP-R may each have a shape in which what is shown in FIG. 4A is vertically inverted. The color filter layer CFL-1 may be formed by using an upper surface of the light control layer CCL-1 as a base surface, and may thus have a different shape from what is shown in FIG. 4A.

In the color filter layer CFL-1 according to an embodiment, the light blocking portion BM may be a black matrix. The light blocking portion BM may be formed including an organic light blocking material or an inorganic light blocking material, both including a black pigment or a black dye. The light blocking portion BM may prevent light leakage, and separate boundaries between the adjacent color filters CF1, CF2, and CF3.

Referring to FIG. 4C, the display panel DP-2 according to an embodiment may include a base substrate BS, a circuit element layer DP-CL disposed on the base substrate BS, a lower panel including a display element layer DP-LED1 disposed on the circuit element layer DP-CL, and an optical structure layer OSL disposed on the lower panel. For example, the display element layer DP-LED1 included in the display panel DP-2 according to an embodiment may include a light emitting element LED-1, and the light emitting element LED-1 may be a micro LED element or a Nano LED element. The light emitting element LED-1 may be disposed between the pixel defining films PDL and electrically connected to a contact portion S-C, and the light emitting element LED-1 may have a length and a width of several hundred nanometers to several hundred micrometers. The light emitting element LED-1 may be an LED element including an active layer and at least one semiconductor material layer. The light emitting element LED-1 may further include an insulating layer covering surfaces of the active layer and the semiconductor material layer. The light emitting element LED-1 may be patterned and disposed to overlap each of the pixel regions PXA-R, PXA-B, and PXA-G. The display panel DP may include a buffer layer BFL disposed on the light emitting element LED-1. The buffer layer BFL may be disposed on the light emitting element LED-1 to cover the light emitting element LED-1. A filling layer FML may be disposed between the buffer layer BFL and the optical structure layer OSL. In an embodiment, the filling layer FML may fill a space between the display element layer DP-LED1 and the light control layer CCL. The filling layer FML may be disposed (e.g., directly disposed) on the buffer layer BFL, and an additional barrier layer CAP2 may be disposed (e.g., directly disposed) on the filling layer FML. In another example, in the display panel DP-2 of an embodiment shown in FIG. 4C, the buffer layer BFL may be omitted.

Figure 6A:
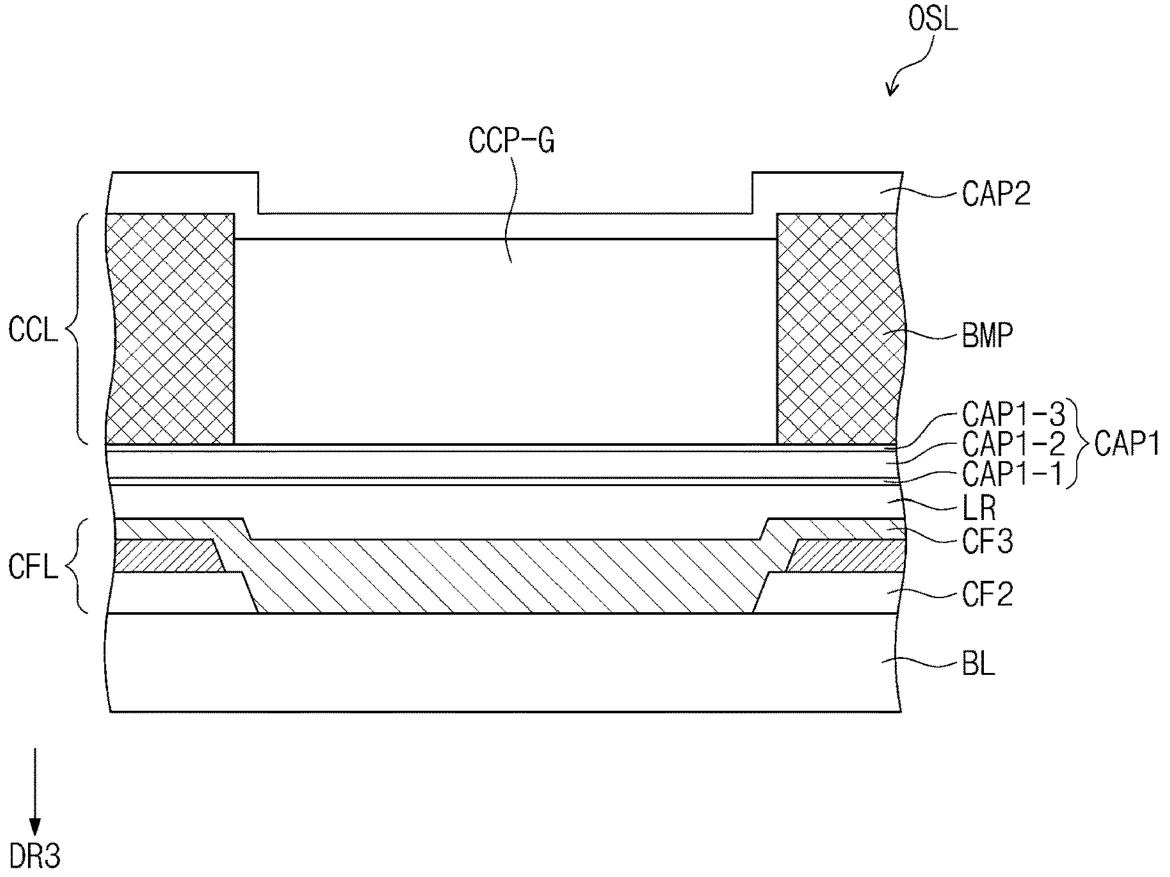
FIG. 6A is a schematic cross-sectional view of some components of a display panel according to an embodiment.
Figure 6B:
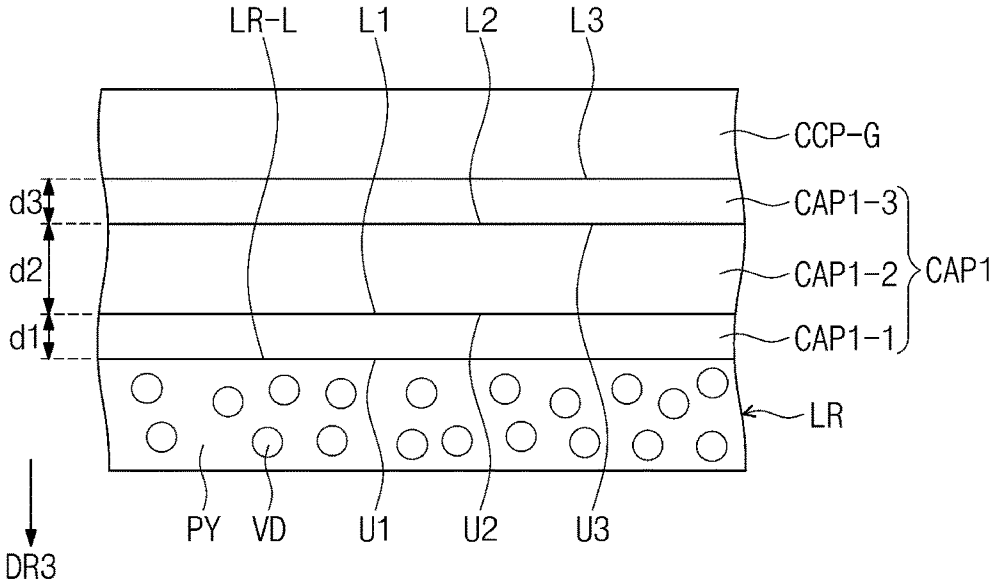
FIG. 6B is a schematic plan view enlarging some components of a display panel according to an embodiment.

FIG. 6A is a schematic cross-sectional view of some components of a display panel according to an embodiment. FIG. 6B is a schematic plan view enlarging some components of a display panel according to an embodiment. FIG. 6A enlarges and shows some components of the light control layer CCL, the barrier layer CAP1, the additional barrier layer CAP2, and the low refractive layer LR, and the color filter layer CFL included in the optical structure layer OSL of the display panel DP according to an embodiment. In FIG. 6B, the barrier layer CAP1 shown in FIG. 6A and the components adjacent thereto are simply enlarged and shown. Hereinafter, in describing the barrier layer CAP1 included in the optical structure layer OSL of an embodiment through FIGS. 6A and 6B, the third light control pattern layer CCP-G is referred to as a "light control pattern layer". For example, in FIGS. 6A and 6B, the components shown in FIGS. 3 and 4A are rotated by 180°, and thus the upper surface based on FIGS. 6A and 6B is referred to as the "lower surface" and the lower surface is referred to as the "upper surface".

Referring to FIGS. 3, 4A, 6A, and 6B, as described above, the optical structure layer OSL may include the barrier layer CAP1 disposed on a surface of the light control pattern layer CCP-G. The barrier layer CAP1 may be disposed between the light control pattern layer CCP-G and the low refractive layer LR. For example, the barrier layer CAP1 may be disposed on an upper surface of the light control pattern layer CCP-G.

The barrier layer CAP1 may be disposed (e.g., directly disposed) on upper surfaces of the light control pattern layer CCP-G and the bank BMP. For example, the barrier layer CAP1 may contact the upper surfaces of the light control pattern layer CCP-G and the bank BMP.

The barrier layer CAP1 may be disposed between the light control pattern layer CCP-G and the low refractive layer LR, and may be disposed (e.g., directly disposed) below the low refractive layer LR. The barrier layer CAP1 may contact a lower surface LR-L of the low refractive layer LR.

The barrier layer CAP1 may have a multi-layer structure, and a plurality of layers each included in the barrier layer CAP1 may include silicon oxynitride ($SiO_xN_y$). The barrier layer CAP1 may have a structure of a plurality of layers that are distinguished from each other with interfaces defined therebetween. The barrier layer CAP1 may have a multi-layer structure and may limit a composition ratio of silicon, oxygen, and nitrogen in silicon oxynitride films to a certain range to prevent moisture/oxygen from penetrating into the first light control pattern layer CCP-R, may increase film durability, and may have a refractive index range that does not reduce light efficiency of a display panel.

In an embodiment, the barrier layer CAP1 may include a first layer CAP1-1, a second layer CAP1-2, and a third layer CAP1-3 sequentially stacked from the low refractive layer LR. The first layer CAP1-1, the second layer CAP1-2, and the third layer CAP1-3 each may include silicon oxynitride.

The first layer CAP1-1 may be adjacent to the low refractive layer LR and may correspond to a silicon oxynitride layer having a relatively high amount of oxygen. The first layer CAP1-1 may be a layer disposed (e.g., directly disposed) below the low refractive layer LR. The first layer CAP1-1 may contact the low refractive layer LR. An upper surface U1 of the first layer CAP1-1 may contact the lower surface LR-L of the low refractive layer LR.

The first layer CAP1-1 may be a layer having a low amount of nitrogen, and the first layer CAP1-1 may have nitrogen in an amount of less than about 1 at %. The first layer CAP1-1 may have, for example, nitrogen in an amount of about 0.1 at % to about 0.7 at %. Silicon oxynitride included in the first layer CAP1-1 may have a composition ratio of nitrogen in an amount of less than about 1 at %, oxygen in an amount of about 45 at % to about 70 at %, and silicon in an amount of about 30 at % to about 55 at %. Silicon oxynitride included in the first layer CAP1-1, for example, may have a composition ratio of nitrogen in an amount of 1 at % or less, oxygen in an amount of about 58 at % to about 70 at %, and silicon in an amount of about 30 at % to about 42 at %. The first layer CAP1-1 may have a relatively low concentration of nitrogen atom composition, and thus, film degeneration may be prevented at high temperature and high humidity. For example, defects such as staining and lifting may not be caused and outgas may be less emitted.

The second layer CAP1-2 may be disposed on the first layer CAP1-1 and corresponds to a silicon oxynitride layer having a relatively high amount of nitrogen. The second layer CAP1-2 may be a layer spaced apart from the low refractive layer LR with the first layer CAP1-1 therebetween. The second layer CAP1-2 may be a layer disposed (e.g., directly disposed) below the first layer CAP1-1. The second layer CAP1-2 may contact the first layer CAP1-1. An upper surface U2 of the second layer CAP1-2 may contact the lower surface L1 of the first layer CAP1-1.

The second layer CAP1-2 may be a layer having a high amount of nitrogen, and the second layer CAP1-2 may have nitrogen in an amount of about 3 at % to about 30 at %. The second layer CAP1-2 may have nitrogen in an amount of, for example, about 15 at % to about 22 at %. Silicon oxynitride included in the second layer CAP1-2 may have a composition ratio of nitrogen in an amount of about 3 at % to about 30 at %, oxygen in an amount of about 25 at % to about 50 at %, and silicon in an amount of about 30 at % to about 55 at %. Silicon oxynitride included in the first layer CAP1-2, for example, may have a composition ratio of nitrogen in an amount of about 15 at % to about 22 at %, oxygen in an amount of about 38 at % to about 48 at %, and silicon in an amount of about 30 at % to about 42 at %. The second layer CAP1-2 may have a relatively high concentration of nitrogen atom composition, and thus may have high robustness to plasma. The optical structure layer OSL may include the barrier layer CAP1 including the second layer CAP1-2, and may thus prevent organic materials included in the low refractive layer LR from being damaged by plasma and the like applied in case that the barrier layer CAP1 is formed. For example, as the second layer CAP1-2 satisfies the composition ratio described above, an amount of surface moisture adsorption may be reduced, so that the second layer CAP1-2 may have excellent moisture barrier properties.

The third layer CAP1-3 may be adjacent to the second layer CAP1-2 and corresponds to a silicon oxynitride layer having a relatively high amount of oxygen. The third layer CAP1-3 may be a layer disposed (e.g., directly disposed) below the second layer CAP1-2. The third layer CAP1-3 may contact the second layer CAP1-2. An upper surface U3 of the third layer CAP1-3 may contact the lower surface L2 of the second layer CAP1-2. For example, the third layer CAP1-3 may be disposed (e.g., directly disposed) on the light control pattern layer CCP-G disposed therebelow. The third layer CAP1-3 may contact the light control pattern layer CCP-G disposed therebelow. A lower surface L3 of the third layer CAP1-3 may contact an upper surface of the light control pattern layer CCP-G.

The third layer CAP1-3 may be a layer having a low amount of nitrogen, and the third layer CAP1-3 may have nitrogen in an amount of less than about 3.2 at %. The third layer CAP1-3 may have, for example, nitrogen in an amount of about 0.1 at % to about 3 at %. Silicon oxynitride included in the third layer CAP1-3 may have a composition ratio of nitrogen in an amount of less than about 3.2 at %, oxygen in an amount of about 45 at % to about 70 at %, and silicon in an amount of about 30 at % to about 55 at %. Silicon oxynitride included in the third layer CAP1-3, for example, may have a composition ratio of nitrogen in an amount of 3 at % or less, oxygen in an amount of about 58 at % to about 70 at %, and silicon in an amount of about 30 at % to about 42 at %. The third layer CAP1-3 may have a relatively low concentration of nitrogen atom composition, and thus, film degeneration may be prevented at high temperature and high humidity. For example, defects such as staining and lifting may not be caused and outgas may be less emitted. For example, the third layer CAP1-3 may satisfy the composition ratio described above and thus may have a low refractive index, so that a display panel may have improved light emission efficiency.

In silicon oxynitride included in the first layer CAP1-1 and silicon oxynitride included in the second layer CAP1-2, the second layer CAP1-2 may have an amount of nitrogen, which is about 3 times to about 60 times greater than the first layer CAP1-1. For example, the second layer CAP1-2 may have an amount of nitrogen, which is about 15 times to about 40 times greater than the first layer CAP1-1. In the barrier layer CAP1, the first layer CAP1-1 having a relatively low amount of nitrogen may be adjacent to the low refractive layer LR to prevent film degeneration at high temperature and high humidity, and moisture entering from the low refractive layer LR may be effectively blocked.

The barrier layer CAP1 may have a total thickness of about 2,000 Å to about 12,000 Å.

The first layer CAP1-1 may have a thickness d1 of about 500 angstrom (Å) to about 5,000 angstroms (Å). In case that the thickness d1 of the first layer CAP1-1 is less than about 500 Å, film degeneration in which the barrier layer CAP1 expands at high temperature and high humidity may be caused, resulting in degradation in moisture barrier properties of the barrier layer CAP1. In case that the thickness d1 of the first layer CAP1-1 is greater than about 5,000 Å, a film having a uniform thickness and composition may be hardly achieved in a process to degrade film properties, and the thick barrier layer CAP1 may cause greater stress applied to the optical structure layer OSL to damage a substrate.

The second layer CAP1-2 may have a thickness d2 of about 600 angstrom (Å) to about 5,000 angstroms (Å). In case that the thickness d2 of the second layer CAP1-2 is less than about 600 Å, the low refractive layer LR may be damaged by plasma applied in the film forming process. In case that the thickness d2 of the second layer CAP1-2 is greater than about 5000 Å, a film having a uniform thickness and composition may be hardly achieved in a process to degrade film properties, and the thick barrier layer CAP1 may cause greater stress applied to the optical structure layer OSL to damage a substrate.

The third layer CAP1-3 may have a thickness d3 of about 500 angstrom (Å) to about 5,000 angstroms (Å). In case that the thickness d3 of the third layer CAP1-3 is less than about 500 Å, recycling of light through the third layer CAP1-3 having a low refractive index may not be achieved. In case that the thickness d3 of the third layer CAP1-3 is greater than about 5,000 Å, a film having a uniform thickness and composition may be hardly achieved in a process to degrade film properties, and the thick barrier layer CAP1 may cause greater stress applied to the optical structure layer OSL to damage a substrate.

The third layers CAP1-3 included in the barrier layer CAP1 may have a lower refractive index than adjacent layers. The third layer CAP1-3 may have a lower refractive index than the adjacent second layer CAP1-2 and the light control pattern layer CCP-G.

The third layer CAP1-3 may have a refractive index of about 1.3 to about 1.5. For example, the third layer CAP1-3 may have a refractive index of about 1.3 to about 1.5 with respect to light in a wavelength range of about 400 nm to about 700 nm.

The first layer CAP1-1 may have a refractive index of about 1.3 to about 1.5. For example, the first layer CAP1-1 may have a refractive index of about 1.3 to about 1.5 with respect to light in a wavelength range of about 400 nm to about 700 nm.

The second layer CAP1-2 may have a refractive index of about 1.4 to about 1.8. For example, the second layer CAP1-2 may have a refractive index of about 1.4 to about 1.8 with respect to light in a wavelength range of about 400 nm to about 700 nm.

In an embodiment, the third layer CAP1-3 included in the barrier layer CAP1 may have a lower refractive index than the adjacent light control pattern layer CCP-G, and a difference in the refractive index between the third layer CAP1-3 and the light control pattern layer CCP-G may be about 0.1 to about 0.25. For example, the difference in the refractive index between the third layer CAP1-3 and the light control pattern layer CCP-G may be about 0.15 to about 0.2. In an embodiment, the light control pattern layer CCP-G may have a refractive index of about 1.5 to about 1.7.

In an embodiment, the refractive index of the third layer CAP1-3 included in the barrier layer CAP1 may be adjusted to be lower than the refractive index of the light control pattern layer CCP-G, and the difference in the refractive index between the third layer CAP1-3 and the light control pattern layer CCP-G may be adjusted to about 0.1 or greater. For example, as described above, the third layer CAP1-3 according to an embodiment may adjust the composition ratio of silicon, oxygen, and nitrogen to set the third layer CAP1-3 to have a lower refractive index than the light control pattern layer CCP-G by 0.1 or greater. Accordingly, the light control pattern layer CCP-G may have greater light extraction efficiency, and reflection light may be prevented from entering the light control pattern layer CCP-G.

In an embodiment, the first layer CAP1-1 included in the barrier layer CAP1 may have a higher refractive index than the adjacent low refractive layer LR. The low refractive layer may have a low refractive index of about 1.3 or less with respect to light in a wavelength range of about 400 nm to about 700 nm. The first layer CAP1-1 may have a higher refractive index than the adjacent low refractive layer LR, and the low refractive layer LR may thus have greater light extraction efficiency and anti-reflection properties.

The light control layer CCL according to an embodiment may further include an additional barrier layer CAP2. The additional barrier layer CAP2 may be disposed below the light control pattern layer CCP-G. For example, the additional barrier layer CAP2 may be disposed between the light control pattern layer CCP-G and the filling layer FML.

Like the barrier layer CAP1, the additional barrier layer CAP2 may include silicon oxynitride. A composition ratio of silicon, oxygen, and nitrogen in the additional barrier layer CAP2 including silicon oxynitride may be in the same range as that of any one of a plurality of layers included in the barrier layer CAP1 described above. The additional barrier layer CAP2 may include silicon oxynitride, and, like the first layer CAP1-1, may have a composition ratio of nitrogen in an amount of about less than about 1 at %, oxygen in an amount of about 45 at % to about 70 at %, and silicon in an amount of about 30 at % to about 55 at %. However, embodiments are not limited thereto, and the additional barrier layer CAP2 may include silicon oxynitride, but may have a composition ratio in a range different from the composition ratio of silicon, oxygen, and nitrogen of the plurality of layers included in the barrier layer CAP1. In another example, the additional barrier layer CAP2 may include silicon oxide or silicon nitride instead of silicon oxynitride. The additional barrier layer CAP2 may also include titanium oxide or aluminum oxide.

The additional barrier layer CAP2 may have a lower refractive index than the adjacent light control pattern layer CCP-G. The additional barrier layer CAP2 may have a refractive index of about 1.3 to about 1.8. For example, the additional barrier layer CAP2 may have a refractive index of about 1.4 to about 1.5 with respect to light in a wavelength range of about 400 nm to about 700 nm.

In an embodiment, the additional barrier layer CAP2 may have a lower refractive index than the adjacent light control pattern layer CCP-G, and a difference in the refractive index between the additional barrier layer CAP2 and the light control pattern layer CCP-G may be about 0.1 to about 0.25. For example, the difference in the refractive index between the additional barrier layer CAP2 and the light control pattern layer CCP-G may be about 0.15 to about 0.2. In an embodiment, the light control pattern layer CCP-G may have a refractive index of about 1.6 to about 1.95. Accordingly, total reflection of light moving from the light control pattern layer CCP-G toward the additional barrier layer CAP2 may be induced, and thus light traveling (or transmitting) in a lower direction may be recycled. Accordingly, the light control pattern layer CCP-G may have greater light conversion efficiency, and in case that the light control pattern layer CCP-G is applied to the display panel, the display panel may have improved display efficiency.

The additional barrier layer CAP2 according to an embodiment may have a lower refractive index than the filling layer FML, and a difference in the refractive index between the additional barrier layer CAP2 and the filling layer FML may be adjusted to about 0.1 or less. For example, the additional barrier layer CAP2 according to an embodiment may adjust the composition ratio of silicon, oxygen, and nitrogen as described above, so that the additional barrier layer CAP2 may be adjusted to have a lower refractive index than the filling layer FML, but the difference may be adjusted to be within a range of about 0.1 or less. Accordingly, an issue that a path of light traveling (or transmitting) from the filling layer FML toward the additional barrier layer CAP2 is changed by refraction and total reflection and thus the light fails to travel toward the light control pattern layer CCP-G may be prevented.

The additional barrier layer CAP2 may have a thickness of about 2,000 Å to about 12,000 Å. The additional barrier layer CAP2 may have a thickness of, for example, about 4,000 Å to about 8,000 Å. In case that the thickness of the additional barrier layer CAP2 is less than about 2,000 Å, moisture and oxygen barrier properties may be reduced, and moisture may thus penetrate the light control pattern layer CCP-G, and durability may be reduced, resulting in defects such as lifting or film breakage. In case that the thickness of the additional barrier layer CAP2 is greater than about 12,000 Å, a film having a uniform thickness and composition may be hardly achieved in a process to degrade film properties, and the thick additional barrier layer CAP2 may cause greater stress applied to the optical structure layer OSL to damage a substrate.

The barrier layer CAP1 according to an embodiment may have a multi-layer structure including silicon oxynitride, and may differently adjust an amount of nitrogen of each layer to exhibit (or have) excellent moisture and oxygen barrier properties, excellent film durability at high temperature and high humidity so as to prevent defects such as degeneration and cracking of the film due to external factors. For example, the refractive index of the barrier layer CAP1 may be adjusted to correspond to the refractive index of adjacent layers to improve the light conversion efficiency of the light control pattern layer. For example, the barrier layer CAP1 may include a structure in which the first layer CAP1-1 having a relatively low amount of nitrogen, the second layer CAP1-2 having a relatively high amount of nitrogen, and the third layers CAP1-3 having a low amount of nitrogen and the having a refractive index adjusted to be low are sequentially stacked, and accordingly, film degeneration may be prevented at high temperature and high humidity, moisture entering (or permeated) from the low refractive layer LR may be effectively blocked, and damage to the low refractive layer LR due to plasma applied when the barrier layer CAP1 is formed may be prevented. For example, the light emission efficiency of the optical structure layer OSL and the display panel DP including the barrier layer CAP1 may be improved through the third layer CAP1-3 having a low refractive index.

The low refractive layer LR may be disposed above the barrier layer CAP1 in the third direction DR3 and may have a structure in which hollow particles are dispersed in an organic base layer. As shown in FIG. 6B, the low refractive layer LR may include a base resin PY and hollow particles VD dispersed in the base resin PY. The low refractive layer LR may include the hollow particles VD and may thus have a low refractive index.

With respect to a total weight of the low refractive layer LR, the base resin PY may have a weight of about 50 wt % to about 90 wt %. The base resin PY may include at least one of an acrylic-based resin, a silicone-based resin, and an epoxy-based resin. For example, the base resin PY may include silicon acrylate.

In an embodiment, the hollow particles VD may be derived from porogen. The low refractive layer LR may be formed from a composition in which a polymer resin and porogen are mixed. The base resin PY may be formed by solidifying the polymer resin of the composition, and the hollow particles VD may be formed by thermally decomposing the porogen. The hollow particles VD formed from the porogen may have a spherical shape. The hollow particles VD may be in a vacuum or may have a very small amount of gas. In another example, the hollow particles VD may each be filled with air or liquid.

With respect to the total weight of the low refractive layer LR, the porogen may be provided in an amount of about 10 wt % to about 40 wt %. The low refractive layer LR including the hollow particles VD formed from the porogen in an amount of about 10 wt % to about 30 wt % may satisfy the refractive index range of the low refractive layer LR according to an embodiment, and may exhibit (or have) excellent durability.

For example, the low refractive layer LR may further include additional materials such as inorganic particles in addition to the base resin PY and hollow particles VD. The inorganic particles may contain (or include) at least one of $SiO_2$, $MgF_2$, or $Fe_3O_4$.

The low refractive layer LR may be formed by a slit coating process, a spin coating process, a roll coating process, a spray coating process, or an inkjet printing process. However, this is presented as an example, and the method of forming the low refractive layer LR is not limited thereto. The low refractive layer LR may be formed by using various methods such as a transfer method.

The low refractive layer LR may have a lower refractive index than adjacent components. The low refractive layer LR may have a lower refractive index than each of the light control pattern layer CCP-G included in the light control layer CCL, and the barrier layer CAP1. In an embodiment, the low refractive layer LR may have a refractive index of about 1.21 to about 1.25. The low refractive layer LR may totally reflect some of the blue light emitted from the light control layer CCL toward the color filter layer CFL to be re-incident to the light control layer CCL. The low refractive layer LR having a refractive index of about 1.21 to about 1.25 may exhibit (or have) total reflection due to a difference in refractive index with the light control layer CCL.

The low refractive layer LR may have a haze value of less than about 0.40%. The low refractive layer LR having a haze value of less than about 0.40% may be optically transparent.

Figure 7:
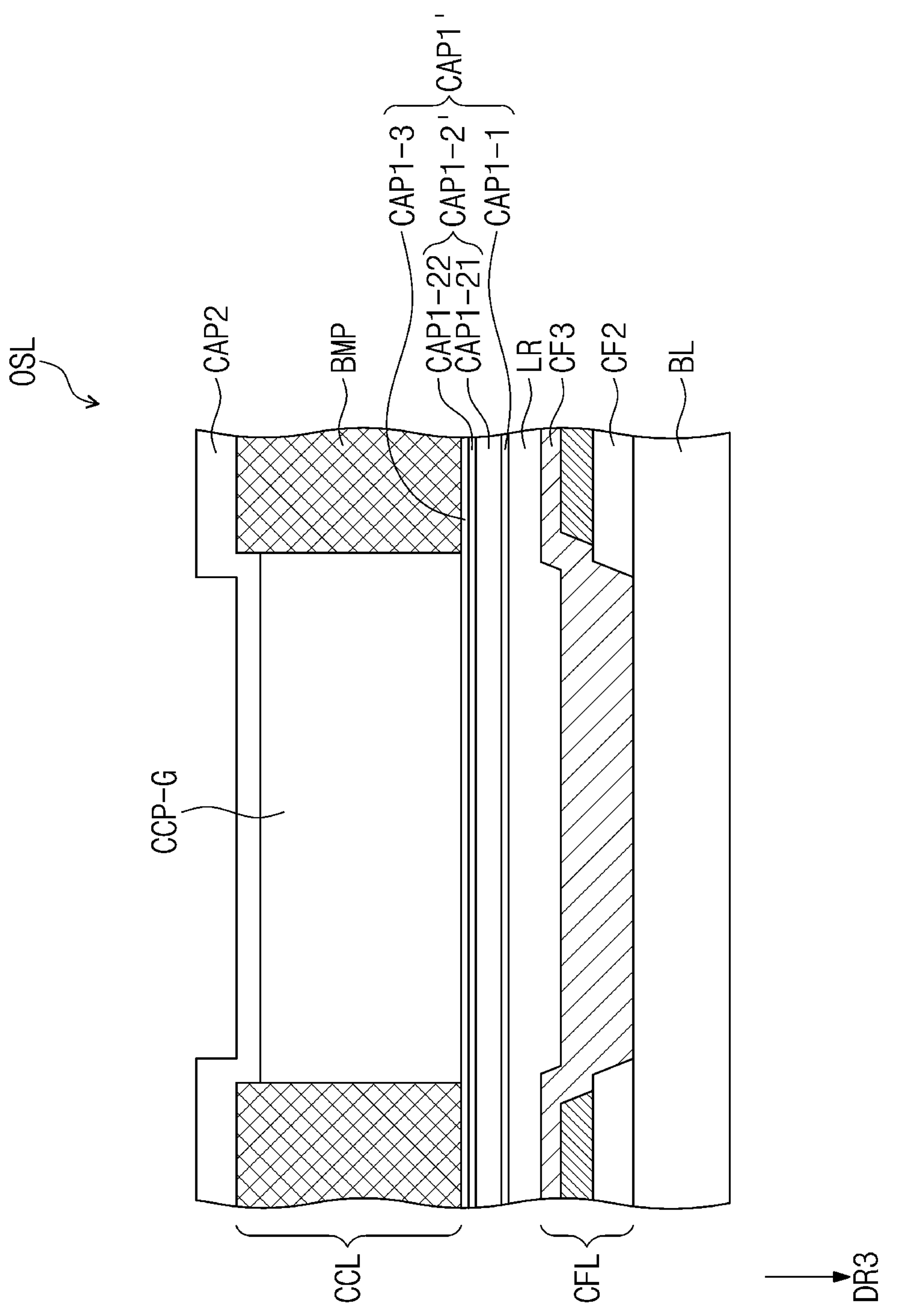
FIG. 7 is a schematic cross-sectional view of some components of a display panel according to an embodiment.

FIG. 7 is a schematic cross-sectional view of some components of a display panel according to an embodiment. In FIG. 7, in a cross section corresponding to FIG. 6A, an optical structure layer OSL of an embodiment different from the optical structure layer OSL shown in FIG. 6A is shown.

Referring to FIG. 7, a second layer CAP1-2' included in a barrier layer CAP1' may have a multi-layer structure. The second layer CAP1-2' may include a (2-1)-th layer CAP1-21 adjacent to the first layer CAP1-1, and a (2-2)-th layer CAP1-22 disposed between the (2-1)-th layer CAP1-21 and the third layer CAP1-3. For example, although FIG. 7 shows, as an example, that the second layer CAP1-2' having a multi-layer structure includes two layers, but embodiments are not limited thereto. For example, the second layer CAP1-2' may include three or more layers.

The (2-1)-th layer CAP1-21 and (2-2)-th layer CAP1-22 may each include silicon oxynitride, but may have a different composition ratio. The (2-1)-th layer CAP1-21 and the (2-2)-th layer CAP1-22 may have different amounts of nitrogen. The (2-1)-th layer CAP1-21 and the (2-2)-th layer CAP1-22 may conform to the limited range of the composition ratio of silicon, oxygen and nitrogen of the second layer CAP1-2' described above, but may have a different composition ratio. The (2-1)-th layer CAP1-21 and the (2-2)-th layer CAP1-22 included in the second layer CAP1-2' may each have a composition ratio of silicon, oxygen, and nitrogen adjusted to a different range to improve durability and optical properties of the optical structure layer OSL.

Table 1 below shows reliability evaluation results at high temperature and high humidity according to a stack structure of the display panel including the barrier layer described above and an amount of nitrogen for each layer. In Table 1, the barrier layer of Example may be a barrier layer having a three-layer stack structure of a first layer, a second layer, and a third layer as shown in FIGS. 6A and 6B, and the barrier layer of Comparative Example corresponds to a barrier layer having a two-layer stack structure, unlike the barrier layer of Example. For example, in the reliability evaluation, after leaving it for 500 hours at 95° C. and 85% humidity, the presence of lifting of the barrier layer was observed, and a case where lifting was observed was evaluated as "defective".

TABLE 1

| Item | Stack structure | No. of defects/No. of evaluations | Time for defect occurrence |
|---|---|---|---|
| Example 1 | first layer (N 0.5%) 700 Å/ second layer (N 19.1%) 1500 Å/ third layer (N 0.4%) 800 Å | 0:2 | — |
| Example 2 | first layer (N 0.5%) 500 Å/ second layer (N 19.1%) 800 Å/ third layer (N 0.4%) 700 Å | 0:2 | — |
| Comparative Example | first layer (N 19.1%) 2,000 Å/ second layer (N 0.4%) 2,000 Å | 16:21 | 500 hr(3) 200 hr(4) 168 hr(6) 336 hr(3) |

Referring to the results of Table 1, in case that the barrier layer of a two-layer structure as in Comparative Example is included, defects, in which the barrier layer is lifted at high temperature and high humidity, have been occurred many times, but in Example, the lifting defect of the barrier layer is not caused at high temperature and high humidity. Based on the results of Table 1, in the barrier layer of Example, as a first layer adjacent to a low refractive layer is formed with nitrogen in an amount of less than about 1 at %, lifting of the barrier layer due to moisture permeation is not caused at high temperature and high humidity reliability evaluation conditions. Accordingly, it is expected that an optical structure layer and a display panel including the barrier layer of Example have increased reliability and durability.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display panel comprising:
a light emitting element that outputs source light, the light emitting element including:
a first electrode,
an emission layer disposed on the first electrode, and
a second electrode disposed on the emission layer; and
an optical structure layer disposed on the light emitting element, wherein
the optical structure layer including:
a light control layer disposed on the light emitting element and including at least one light control pattern layer;
a low refractive layer disposed on the light control layer; and
a barrier layer disposed between the light control layer and the low refractive layer and including silicon oxynitride, and
the barrier layer includes:
a first layer adjacent to the low refractive layer and including nitrogen in an amount of less than about 1 at %;
a second layer disposed spaced apart from the low refractive layer with the first layer therebetween, and including nitrogen in an amount of about 3 at % to about 30 at %; and
a third layer disposed spaced apart from the low refractive layer with the first layer and the second layer therebetween, and including nitrogen in an amount of less than about 3.2 at %.

2. The display panel of claim 1, wherein the third layer has a refractive index of about 1.3 to about 1.5 with respect to light in a wavelength range of about 400 nm to about 700 nm.

3. The display panel of claim 1, wherein:
the first layer is directly disposed on the low refractive layer;
the second layer is directly disposed on the first layer; and
the third layer is directly disposed on the second layer.

4. The display panel of claim 1, wherein the first layer has a thickness of about 500 Å or greater.

5. The display panel of claim 1, wherein the optical structure layer further includes a color filter layer spaced apart from the light control layer with the low refractive layer between the color filter layer and the light control layer and including a plurality of color filters.

6. The display panel of claim 1, wherein
the at least one light control pattern layer comprises:
a first light control pattern layer that converts the source light into first light, and
a second light control pattern layer that transmits the source light, and
the first light control pattern layer comprises quantum dots that convert the source light into the first light.

7. The display panel of claim 1, wherein
the light control layer further comprises a bank adjacent to the at least one light control pattern layer, and
the barrier layer is directly disposed on the at least one light control pattern layer and the bank.

8. The display panel of claim 1, wherein the low refractive layer comprises:

a base resin, and a plurality of hollow particles dispersed in the base resin.

9. The display panel of claim 1, wherein the low refractive layer has a refractive index of about 1.3 or less with respect to light in a wavelength range of about 400 nm to about 700 nm.

10. The display panel of claim 1, wherein the second layer comprises:

a (2-1)-th layer adjacent to the first layer; and a (2-2)-th layer disposed between the (2-1)-th layer and the third layer, and the (2-1)-th layer and the (2-2)-th layer include different amounts of nitrogen from each other.

11. The display panel of claim 1, wherein the optical structure layer further comprises an additional barrier layer spaced apart from the barrier layer with the light control layer between the additional barrier layer and the barrier layer, and the additional barrier layer is directly disposed on the at least one light control pattern layer.

12. The display panel of claim 1, further comprising:

a filling layer disposed between the light emitting element and the optical structure layer and covering the light emitting element.

13. The display panel of claim 1, wherein the first layer has a refractive index of about 1.3 to about 1.5 with respect to light in a wavelength range of about 400 nm to about 700 nm, and the second layer has a refractive index of about 1.4 to about 1.8 with respect to light in a wavelength range of about 400 nm to about 700 nm.

14. The display panel of claim 1, wherein the third layer is in contact with the at least one light control pattern layer.

15. The display panel of claim 1, wherein the light emitting element comprises a plurality of light emitting stack members disposed between the first electrode and the second electrode, each of the plurality of light emitting stack members including the emission layer, the plurality of light emitting stack members include:

a first light emitting stack member disposed on the first electrode and including a first emission layer, a charge generation layer disposed on the first light emitting stack member, and a second light emitting stack member disposed on the charge generation layer and including a second emission layer, and the first emission layer and the second emission layer emit different color lights.

16. A display panel comprising:

a light emitting element that outputs source light, the light emitting element including:

a first electrode, an emission layer disposed on the first electrode, and a second electrode disposed on the emission layer; and an optical structure layer disposed on the light emitting element, wherein the optical structure layer includes:

a light control layer disposed on the light emitting element and including at least one light control pattern layer;

a low refractive layer disposed on the light control layer; and a barrier layer disposed between the light control layer and the low refractive layer, the barrier layer includes a first layer, a second layer, and a third layer that are sequentially disposed from the low refractive layer, each of the first layer, the second layer, and the third layer including silicon oxynitride, the second layer includes an amount of nitrogen, which is about 3 times to about 60 times greater than the first layer, and the third layer includes nitrogen in an amount of less than about 3.2 at %.

17. The display panel of claim 16, wherein:

the first layer is directly disposed below the low refractive layer;

the second layer is directly disposed below the first layer; and the third layer is directly disposed below the second layer.

18. A display panel comprising:

a light emitting element that outputs source light, the light emitting element including:

a first electrode, an emission layer disposed on the first electrode, and a second electrode disposed on the emission layer; and an optical structure layer disposed on the light emitting element, wherein the optical structure layer includes:

a light control layer disposed on the light emitting element and including at least one light control pattern layer;

a low refractive layer disposed on the light control layer; and a barrier layer disposed between the light control layer and the low refractive layer and including silicon oxynitride, the barrier layer includes:

a first layer directly disposed below the low refractive layer and having nitrogen in an amount of less than about 1 at %;

a second layer directly disposed below the first layer and having nitrogen in an amount of about 3 at % to about 30 at %; and a third layer directly disposed below the second layer, and the light control layer is directly disposed below the third layer.

19. The display panel of claim 18, wherein the first layer has a refractive index of about 1.3 to about 1.5 with respect to light in a wavelength range of about 400 nm to about 700 nm;

the second layer has a refractive index of about 1.4 to about 1.8 with respect to light in a wavelength range of about 400 nm to about 700 nm; and the third layer has a refractive index of about 1.3 to about 1.5 with respect to light in a wavelength range of about 400 nm to about 700 nm.

20. The display panel of claim 18, wherein the first layer has a thickness of about 500 Å or greater;

the second layer has a thickness of about 600 Å or greater; and the third layer has a thickness of about 500 Å or greater.

* * * * *